US012787794B2

(12) United States Patent
Costa et al.

(10) Patent No.: US 12,787,794 B2
(45) Date of Patent: Nov. 3, 2026

(54) FRONT-END MODULE WITH VERTICALLY STACKED DIE AND CIRCULATOR

(71) Applicant: Qorvo US, Inc., Greensboro, NC (US)

(72) Inventors: Julio C. Costa, Oak Ridge, NC (US); George Maxim, San Jose, CA (US); Dirk Robert Walter Leipold, San Jose, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 563 days.

(21) Appl. No.: 18/266,523

(22) PCT Filed: Dec. 13, 2021

(86) PCT No.: PCT/US2021/063093

§ 371 (c)(1),
(2) Date: Jun. 9, 2023

(87) PCT Pub. No.: WO2022/126015

PCT Pub. Date: Jun. 16, 2022

(65) Prior Publication Data

US 2023/0387042 A1 Nov. 30, 2023

Related U.S. Application Data

(60) Provisional application No. 63/124,440, filed on Dec. 11, 2020.

(51) Int. Cl.
*H10W 44/00* (2026.01)
*H01P 1/387* (2006.01)
(Continued)

(52) U.S. Cl.
CPC ........... *H10W 44/501* (2026.01); *H01P 1/387* (2013.01); *H10W 46/00* (2026.01);
(Continued)

(58) Field of Classification Search
CPC . H01L 23/645; H01L 21/565; H01L 23/3135; H01L 24/16; H01L 24/32;
(Continued)

(56) References Cited

U.S. PATENT DOCUMENTS 4,093,562 A 6/1978 Kishimoto
4,366,202 A 12/1982 Borovsky
(Continued)

FOREIGN PATENT DOCUMENTS

CN 1256300 A 6/2000
CN 1696231 A 11/2005
(Continued)

OTHER PUBLICATIONS

US 10,896,908 B2, 01/2021, Costa et al. (withdrawn)
(Continued)

*Primary Examiner* — Jose R Diaz
(74) *Attorney, Agent, or Firm* — Withrow & Terranova, P.L.L.C.

(57) ABSTRACT

The present disclosure describes a front-end module (FEM) and a process for making the same. In the disclosed FEM, a thinned flip-chip die, which includes a device region with a metal layer, resides over a module carrier. A mold compound resides over the module carrier, surrounds the thinned flip-chip die, and extends beyond a top surface of the thinned flip-chip die to define an opening over the top surface of the thinned flip-chip die and within the mold compound. A ferrimagnetic portion resides over the top surface of the thinned flip-chip die and within the opening, and a permanent magnetic portion resides over the ferrimagnetic portion and within the opening. Herein, the permanent magnetic portion, the ferrimagnetic portion, and the metal layer of the device region are vertically aligned, and form a circulator vertically stacked with the thinned flip-chip die.

28 Claims, 21 Drawing Sheets

(51) Int. Cl.
*H10W 46/00* (2026.01)
*H10W 74/01* (2026.01)
*H10W 74/10* (2026.01)
*H10W 74/15* (2026.01)
*H10W 90/00* (2026.01)

(52) U.S. Cl.
CPC ....... *H10W 74/012* (2026.01); *H10W 74/016* (2026.01); *H10W 74/121* (2026.01); *H10W 74/15* (2026.01); *H10W 90/724* (2026.01); *H10W 90/734* (2026.01)

(58) Field of Classification Search
CPC .... H01L 24/73; H10W 74/012; H10W 74/15; H10W 44/501; H01P 1/387
See application file for complete search history.

(56) References Cited

U.S. PATENT DOCUMENTS 5,013,681 A 5/1991 Godbey et al.
5,061,663 A 10/1991 Bolt et al.
5,069,626 A 12/1991 Patterson et al.
5,164,687 A 11/1992 Kurian et al.
5,294,295 A 3/1994 Gabriel
5,362,972 A 11/1994 Yazawa et al.
5,391,257 A 2/1995 Sullivan et al.
5,459,368 A 10/1995 Onishi et al.
5,646,432 A 7/1997 Iwaki et al.
5,648,013 A 7/1997 Uchida et al.
5,653,841 A 8/1997 Krishnamurthy et al.
5,699,027 A 12/1997 Tsuji et al.
5,709,960 A 1/1998 Mays et al.
5,729,075 A 3/1998 Strain
5,831,369 A 11/1998 Fürbacher et al.
5,920,142 A 7/1999 Onishi et al.
6,072,557 A 6/2000 Kishimoto
6,084,284 A 7/2000 Adamic, Jr.
6,137,125 A 10/2000 Costas et al.
6,154,366 A 11/2000 Ma et al.
6,154,372 A 11/2000 Kalivas et al.
6,235,554 B1 5/2001 Akram et al.
6,236,061 B1 5/2001 Walpita
6,268,654 B1 7/2001 Glenn et al.
6,271,469 B1 8/2001 Ma et al.
6,377,112 B1 4/2002 Rozsypal
6,423,570 B1 7/2002 Ma et al.
6,426,559 B1 7/2002 Bryan et al.
6,441,498 B1 8/2002 Song
6,446,316 B1 9/2002 Fürbacher et al.
6,578,458 B1 6/2003 Akram et al.
6,649,012 B2 11/2003 Masayuki et al.
6,696,901 B1 * 2/2004 Takeda ..................... H03H 7/52 333/1.1
6,703,688 B1 3/2004 Fitzergald
6,713,859 B1 3/2004 Ma
6,841,413 B2 1/2005 Liu et al.
6,864,156 B1 3/2005 Conn
6,864,540 B1 3/2005 Divakaruni et al.
6,902,950 B2 6/2005 Ma et al.
6,943,429 B1 9/2005 Glenn et al.
6,964,889 B2 11/2005 Ma et al.
6,992,400 B2 1/2006 Tikka et al.
7,042,072 B1 5/2006 Kim et al.
7,049,692 B2 5/2006 Nishimura et al.
7,064,391 B1 6/2006 Conn
7,109,635 B1 9/2006 McClure et al.
7,183,172 B2 2/2007 Lee et al.
7,190,064 B2 3/2007 Wakabayashi et al.
7,238,560 B2 7/2007 Sheppard et al.
7,279,750 B2 10/2007 Jobetto
7,288,435 B2 10/2007 Aigner et al.
7,307,003 B2 12/2007 Reif et al.
7,342,303 B1 3/2008 Berry et al.
7,393,770 B2 7/2008 Wood et al.
7,402,901 B2 7/2008 Hatano et al.
7,427,824 B2 9/2008 Iwamoto et al.
7,489,032 B2 2/2009 Jobetto
7,596,849 B1 10/2009 Carpenter et al.
7,619,347 B1 11/2009 Bhattacharjee
7,635,636 B2 12/2009 McClure et al.
7,714,535 B2 5/2010 Yamazaki et al.
7,723,838 B2 5/2010 Takeuchi et al.
7,749,882 B2 7/2010 Kweon et al.
7,790,543 B2 9/2010 Abadeer et al.
7,816,231 B2 10/2010 Dyer et al.
7,843,072 B1 11/2010 Park et al.
7,855,101 B2 12/2010 Furman et al.
7,868,419 B1 1/2011 Kerr et al.
7,910,405 B2 3/2011 Okada et al.
7,955,955 B2 6/2011 Lane et al.
7,960,218 B2 6/2011 Ma et al.
8,004,089 B2 8/2011 Jobetto
8,183,151 B2 5/2012 Lake
8,299,633 B2 10/2012 Su
8,420,447 B2 4/2013 Tay et al.
8,503,186 B2 8/2013 Lin et al.
8,563,403 B1 10/2013 Farooq et al.
8,568,547 B2 10/2013 Yamazaki et al.
8,643,148 B2 2/2014 Lin et al.
8,658,475 B1 2/2014 Kerr
8,664,044 B2 3/2014 Jin et al.
8,772,853 B2 7/2014 Hong et al.
8,791,532 B2 7/2014 Graf et al.
8,802,495 B2 8/2014 Kim et al.
8,803,242 B2 8/2014 Marino et al.
8,816,407 B2 8/2014 Kim et al.
8,835,978 B2 9/2014 Mauder et al.
8,906,755 B1 12/2014 Hekmatshoartabari et al.
8,921,990 B2 12/2014 Park et al.
8,927,968 B2 1/2015 Cohen et al.
8,941,248 B2 1/2015 Lin et al.
8,963,321 B2 2/2015 Lenniger et al.
8,983,399 B2 3/2015 Kawamura et al.
9,064,883 B2 6/2015 Meyer et al.
9,165,793 B1 10/2015 Wang et al.
9,214,337 B2 12/2015 Carroll et al.
9,349,700 B2 5/2016 Hsieh et al.
9,368,429 B2 6/2016 Ma et al.
9,406,637 B2 8/2016 Wakisaka et al.
9,461,001 B1 10/2016 Tsai et al.
9,520,428 B2 12/2016 Fujimori
9,530,709 B2 12/2016 Leipold et al.
9,613,831 B2 4/2017 Morris et al.
9,646,856 B2 5/2017 Meyer et al.
9,653,428 B1 5/2017 Hiner et al.
9,698,081 B2 7/2017 Yu et al.
9,786,586 B1 10/2017 Shih
9,812,350 B2 11/2017 Costa
9,824,951 B2 11/2017 Leipold et al.
9,824,974 B2 11/2017 Gao et al.
9,859,254 B1 1/2018 Yu et al.
9,875,971 B2 1/2018 Bhushan et al.
9,941,245 B2 4/2018 Skeete et al.
10,134,837 B1 11/2018 Fanelli et al.
10,727,212 B2 7/2020 Moon et al.
10,784,348 B2 9/2020 Fanelli et al.
10,882,740 B2 1/2021 Costa et al.
11,646,289 B2 5/2023 Costa et al.
12,199,065 B2 1/2025 Yu et al.
2001/0004131 A1 6/2001 Masayuki et al.
2002/0070443 A1 6/2002 Mu et al.
2002/0074641 A1 6/2002 Towle et al.
2002/0093392 A1 * 7/2002 Ohata ..................... H01P 1/387 333/1.1
2002/0127769 A1 9/2002 Ma et al.
2002/0127780 A1 9/2002 Ma et al.
2002/0137263 A1 9/2002 Towle et al.
2002/0185675 A1 12/2002 Furukawa
2003/0207515 A1 11/2003 Tan et al.
2004/0021152 A1 2/2004 Nguyen et al.
2004/0093901 A1 5/2004 Kim et al.
2004/0164367 A1 8/2004 Park
2004/0166642 A1 8/2004 Chen et al.

(56) References Cited

U.S. PATENT DOCUMENTS

| | | | |
|---|---|---|---|
| 2004/0173790 | A1 | 9/2004 | Yeo et al. |
| 2004/0219765 | A1 | 11/2004 | Reif et al. |
| 2004/0266159 | A1 | 12/2004 | Gardecki et al. |
| 2005/0037595 | A1 | 2/2005 | Nakahata |
| 2005/0064686 | A1 | 3/2005 | Chidambarrao et al. |
| 2005/0077511 | A1 | 4/2005 | Fitzergald |
| 2005/0079686 | A1 | 4/2005 | Aigner et al. |
| 2005/0212419 | A1 | 9/2005 | Vazan et al. |
| 2005/0258447 | A1 | 11/2005 | Oi et al. |
| 2005/0260842 | A1 | 11/2005 | Kaltalioglu et al. |
| 2006/0009041 | A1 | 1/2006 | Iyer et al. |
| 2006/0057782 | A1 | 3/2006 | Gardes et al. |
| 2006/0099781 | A1 | 5/2006 | Beaumont et al. |
| 2006/0105496 | A1 | 5/2006 | Chen et al. |
| 2006/0108585 | A1 | 5/2006 | Gan et al. |
| 2006/0110887 | A1 | 5/2006 | Huang |
| 2006/0124961 | A1 | 6/2006 | Sakaguchi et al. |
| 2006/0228074 | A1 | 10/2006 | Lipson et al. |
| 2006/0261446 | A1 | 11/2006 | Wood et al. |
| 2007/0020807 | A1 | 1/2007 | Geefay et al. |
| 2007/0034910 | A1 | 2/2007 | Shie |
| 2007/0045738 | A1 | 3/2007 | Jones et al. |
| 2007/0069393 | A1 | 3/2007 | Asahi et al. |
| 2007/0075317 | A1 | 4/2007 | Kato et al. |
| 2007/0121326 | A1 | 5/2007 | Nall et al. |
| 2007/0122943 | A1 | 5/2007 | Foong et al. |
| 2007/0158746 | A1 | 7/2007 | Ohguro |
| 2007/0181992 | A1 | 8/2007 | Lake |
| 2007/0190747 | A1 | 8/2007 | Humpston et al. |
| 2007/0194342 | A1 | 8/2007 | Kinzer |
| 2007/0252481 | A1 | 11/2007 | Iwamoto et al. |
| 2007/0276092 | A1 | 11/2007 | Kanae et al. |
| 2008/0020513 | A1 | 1/2008 | Jobetto |
| 2008/0050852 | A1 | 2/2008 | Hwang et al. |
| 2008/0050901 | A1 | 2/2008 | Kweon et al. |
| 2008/0087959 | A1 | 4/2008 | Monfray et al. |
| 2008/0157303 | A1 | 7/2008 | Yang |
| 2008/0164528 | A1 | 7/2008 | Cohen et al. |
| 2008/0251927 | A1 | 10/2008 | Zhao et al. |
| 2008/0265978 | A1 | 10/2008 | Englekirk |
| 2008/0272497 | A1 | 11/2008 | Lake |
| 2008/0277800 | A1 | 11/2008 | Hwang et al. |
| 2008/0315372 | A1 | 12/2008 | Kuan et al. |
| 2009/0008714 | A1 | 1/2009 | Chae |
| 2009/0010056 | A1 | 1/2009 | Kuo et al. |
| 2009/0014856 | A1 | 1/2009 | Knickerbocker |
| 2009/0090979 | A1 | 4/2009 | Zhu et al. |
| 2009/0179266 | A1 | 7/2009 | Abadeer et al. |
| 2009/0230542 | A1 | 9/2009 | Lin et al. |
| 2009/0243097 | A1 | 10/2009 | Koroku et al. |
| 2009/0261460 | A1 | 10/2009 | Kuan et al. |
| 2009/0302484 | A1 | 12/2009 | Lee et al. |
| 2010/0003803 | A1 | 1/2010 | Oka et al. |
| 2010/0012354 | A1 | 1/2010 | Hedin et al. |
| 2010/0029045 | A1 | 2/2010 | Ramanathan et al. |
| 2010/0045145 | A1 | 2/2010 | Tsuda |
| 2010/0081232 | A1 | 4/2010 | Furman et al. |
| 2010/0081237 | A1 | 4/2010 | Wong et al. |
| 2010/0105209 | A1 | 4/2010 | Winniczek et al. |
| 2010/0109122 | A1 | 5/2010 | Ding et al. |
| 2010/0120204 | A1 | 5/2010 | Kunimoto |
| 2010/0127340 | A1 | 5/2010 | Sugizaki |
| 2010/0173436 | A1 | 7/2010 | Ouellet et al. |
| 2010/0200919 | A1 | 8/2010 | Kikuchi |
| 2010/0314637 | A1 | 12/2010 | Kim et al. |
| 2011/0003433 | A1 | 1/2011 | Harayama et al. |
| 2011/0018126 | A1 | 1/2011 | Kling et al. |
| 2011/0026232 | A1 | 2/2011 | Lin et al. |
| 2011/0036400 | A1 | 2/2011 | Murphy et al. |
| 2011/0062549 | A1 | 3/2011 | Lin |
| 2011/0068433 | A1 | 3/2011 | Kim et al. |
| 2011/0102002 | A1 | 5/2011 | Riehl et al. |
| 2011/0133341 | A1 | 6/2011 | Shimizu et al. |
| 2011/0171792 | A1 | 7/2011 | Chang et al. |
| 2011/0227158 | A1 | 9/2011 | Zhu |
| 2011/0272800 | A1 | 11/2011 | Chino |
| 2011/0272824 | A1 | 11/2011 | Pagaila |
| 2011/0294244 | A1 | 12/2011 | Hattori et al. |
| 2011/0309481 | A1 | 12/2011 | Huang et al. |
| 2012/0003813 | A1 | 1/2012 | Chuang et al. |
| 2012/0045871 | A1 | 2/2012 | Lee et al. |
| 2012/0068276 | A1 | 3/2012 | Lin et al. |
| 2012/0091520 | A1 | 4/2012 | Nakamura |
| 2012/0094418 | A1 | 4/2012 | Grama et al. |
| 2012/0098074 | A1 | 4/2012 | Lin et al. |
| 2012/0104495 | A1 | 5/2012 | Zhu et al. |
| 2012/0119346 | A1 | 5/2012 | Im et al. |
| 2012/0153393 | A1 | 6/2012 | Liang et al. |
| 2012/0168863 | A1 | 7/2012 | Zhu et al. |
| 2012/0256260 | A1 | 10/2012 | Cheng et al. |
| 2012/0292700 | A1 | 11/2012 | Khakifirooz et al. |
| 2012/0299105 | A1 | 11/2012 | Cai et al. |
| 2012/0313243 | A1 | 12/2012 | Chang et al. |
| 2013/0001665 | A1 | 1/2013 | Zhu et al. |
| 2013/0015429 | A1 | 1/2013 | Hong et al. |
| 2013/0037929 | A1 | 2/2013 | Essig et al. |
| 2013/0049205 | A1 | 2/2013 | Meyer et al. |
| 2013/0082399 | A1 | 4/2013 | Kim et al. |
| 2013/0099315 | A1 | 4/2013 | Zhu et al. |
| 2013/0105966 | A1 | 5/2013 | Kelkar et al. |
| 2013/0147009 | A1 | 6/2013 | Kim |
| 2013/0155681 | A1 | 6/2013 | Nall et al. |
| 2013/0196483 | A1 | 8/2013 | Dennard et al. |
| 2013/0200456 | A1 | 8/2013 | Zhu et al. |
| 2013/0221493 | A1 | 8/2013 | Kim et al. |
| 2013/0241040 | A1 | 9/2013 | Tojo et al. |
| 2013/0280826 | A1 | 10/2013 | Scanlan et al. |
| 2013/0299871 | A1 | 11/2013 | Mauder et al. |
| 2013/0334698 | A1 | 12/2013 | Mohammed et al. |
| 2014/0015131 | A1 | 1/2014 | Meyer et al. |
| 2014/0021583 | A1 | 1/2014 | Lo et al. |
| 2014/0035129 | A1 | 2/2014 | Stuber et al. |
| 2014/0134803 | A1 | 5/2014 | Kelly et al. |
| 2014/0168014 | A1 | 6/2014 | Chih et al. |
| 2014/0197530 | A1 | 7/2014 | Meyer et al. |
| 2014/0210314 | A1 | 7/2014 | Bhattacharjee et al. |
| 2014/0219604 | A1 | 8/2014 | Hackler, Sr. et al. |
| 2014/0252566 | A1 | 9/2014 | Kerr et al. |
| 2014/0252567 | A1 | 9/2014 | Carroll et al. |
| 2014/0264813 | A1 | 9/2014 | Lin et al. |
| 2014/0264818 | A1 | 9/2014 | Lowe, Jr. et al. |
| 2014/0306324 | A1 | 10/2014 | Costa et al. |
| 2014/0323064 | A1 | 10/2014 | McCarthy |
| 2014/0327003 | A1 | 11/2014 | Fuergut et al. |
| 2014/0327150 | A1 | 11/2014 | Jung et al. |
| 2014/0346573 | A1 | 11/2014 | Adam et al. |
| 2014/0356602 | A1 | 12/2014 | Oh et al. |
| 2015/0015321 | A1 | 1/2015 | Dribinsky et al. |
| 2015/0021754 | A1 | 1/2015 | Lin et al. |
| 2015/0060956 | A1 | 3/2015 | Chen |
| 2015/0060967 | A1 | 3/2015 | Yokoyama et al. |
| 2015/0076713 | A1 | 3/2015 | Tsai et al. |
| 2015/0097302 | A1 | 4/2015 | Wakisaka et al. |
| 2015/0108666 | A1 | 4/2015 | Engelhardt et al. |
| 2015/0115416 | A1 | 4/2015 | Costa et al. |
| 2015/0130045 | A1 | 5/2015 | Tseng et al. |
| 2015/0136858 | A1 | 5/2015 | Finn et al. |
| 2015/0162307 | A1 | 6/2015 | Chen et al. |
| 2015/0171006 | A1 | 6/2015 | Hung et al. |
| 2015/0171243 | A1 | 6/2015 | Lee |
| 2015/0197419 | A1 | 7/2015 | Cheng et al. |
| 2015/0235990 | A1 | 8/2015 | Cheng et al. |
| 2015/0235993 | A1 | 8/2015 | Cheng et al. |
| 2015/0243881 | A1 | 8/2015 | Sankman et al. |
| 2015/0255368 | A1 | 9/2015 | Costa |
| 2015/0262844 | A1 | 9/2015 | Meyer et al. |
| 2015/0279789 | A1 | 10/2015 | Mahajan et al. |
| 2015/0311132 | A1 | 10/2015 | Kuo et al. |
| 2015/0364344 | A1 | 12/2015 | Yu et al. |
| 2015/0380394 | A1 | 12/2015 | Jang et al. |
| 2015/0380523 | A1 | 12/2015 | Hekmatshoartabari et al. |
| 2016/0002510 | A1 | 1/2016 | Champagne et al. |
| 2016/0056544 | A1 | 2/2016 | Garcia et al. |
| 2016/0079137 | A1 | 3/2016 | Leipold et al. |

(56) References Cited

U.S. PATENT DOCUMENTS

| | | | |
|---|---|---|---|
| 2016/0079233 | A1 | 3/2016 | Deboy et al. |
| 2016/0093580 | A1 | 3/2016 | Scanlan et al. |
| 2016/0100489 | A1 | 4/2016 | Costa et al. |
| 2016/0118414 | A1 | 4/2016 | Singh et al. |
| 2016/0126111 | A1 | 5/2016 | Leipold et al. |
| 2016/0126196 | A1 | 5/2016 | Leipold et al. |
| 2016/0133591 | A1 | 5/2016 | Hong et al. |
| 2016/0141249 | A1 | 5/2016 | Kang et al. |
| 2016/0141263 | A1 | 5/2016 | Lin et al. |
| 2016/0155706 | A1 | 6/2016 | Yoneyama et al. |
| 2016/0260745 | A1 | 9/2016 | Huang et al. |
| 2016/0284568 | A1 | 9/2016 | Morris et al. |
| 2016/0284570 | A1 | 9/2016 | Morris et al. |
| 2016/0300771 | A1 | 10/2016 | Lin |
| 2016/0343592 | A1 | 11/2016 | Costa et al. |
| 2016/0343604 | A1 | 11/2016 | Costa et al. |
| 2016/0347609 | A1 | 12/2016 | Yu et al. |
| 2016/0362292 | A1 | 12/2016 | Chang et al. |
| 2017/0005000 | A1 | 1/2017 | Beyne |
| 2017/0024503 | A1 | 1/2017 | Connelly |
| 2017/0032957 | A1 | 2/2017 | Costa et al. |
| 2017/0033026 | A1 | 2/2017 | Ho et al. |
| 2017/0053938 | A1 | 2/2017 | Whitefield |
| 2017/0062284 | A1 | 3/2017 | Mason et al. |
| 2017/0062366 | A1 | 3/2017 | Enquist |
| 2017/0077028 | A1 | 3/2017 | Maxim et al. |
| 2017/0084596 | A1 | 3/2017 | Scanlan |
| 2017/0098587 | A1 | 4/2017 | Leipold et al. |
| 2017/0190572 | A1 | 7/2017 | Pan et al. |
| 2017/0200648 | A1 | 7/2017 | Lee et al. |
| 2017/0207350 | A1 | 7/2017 | Leipold et al. |
| 2017/0263539 | A1 | 9/2017 | Gowda et al. |
| 2017/0271200 | A1 | 9/2017 | Costa |
| 2017/0323804 | A1 | 11/2017 | Costa et al. |
| 2017/0323860 | A1 | 11/2017 | Costa et al. |
| 2017/0334710 | A1 | 11/2017 | Costa et al. |
| 2017/0358511 | A1 | 12/2017 | Costa et al. |
| 2018/0005991 | A1 | 1/2018 | Seidemann et al. |
| 2018/0019184 | A1 | 1/2018 | Costa et al. |
| 2018/0019185 | A1 | 1/2018 | Costa et al. |
| 2018/0042110 | A1 | 2/2018 | Cok |
| 2018/0044169 | A1 | 2/2018 | Hatcher, Jr. et al. |
| 2018/0044177 | A1 | 2/2018 | Vandemeer et al. |
| 2018/0047653 | A1 | 2/2018 | Costa et al. |
| 2018/0076174 | A1 | 3/2018 | Costa et al. |
| 2018/0138082 | A1 | 5/2018 | Costa et al. |
| 2018/0138092 | A1 | 5/2018 | Lee et al. |
| 2018/0138227 | A1 | 5/2018 | Shimotsusa et al. |
| 2018/0145678 | A1 | 5/2018 | Maxim et al. |
| 2018/0151461 | A1 | 5/2018 | Cho |
| 2018/0166358 | A1 | 6/2018 | Costa et al. |
| 2018/0174948 | A1 | 6/2018 | Butt et al. |
| 2018/0240759 | A1 | 8/2018 | Haji-Rahim et al. |
| 2018/0240797 | A1 | 8/2018 | Yokoyama et al. |
| 2018/0261470 | A1 | 9/2018 | Costa et al. |
| 2018/0269188 | A1 | 9/2018 | Yu et al. |
| 2018/0275485 | A1 | 9/2018 | Hurwitz |
| 2018/0277632 | A1 | 9/2018 | Fanelli et al. |
| 2018/0331041 | A1 | 11/2018 | Liao et al. |
| 2018/0342439 | A1 | 11/2018 | Costa et al. |
| 2019/0013254 | A1 | 1/2019 | Costa et al. |
| 2019/0013255 | A1 | 1/2019 | Costa et al. |
| 2019/0043812 | A1 | 2/2019 | Leobandung |
| 2019/0057922 | A1 | 2/2019 | Costa et al. |
| 2019/0074263 | A1 | 3/2019 | Costa et al. |
| 2019/0074271 | A1 | 3/2019 | Costa et al. |
| 2019/0104653 | A1 | 4/2019 | Jandzinski et al. |
| 2019/0172826 | A1 | 6/2019 | Or-Bach et al. |
| 2019/0172842 | A1 | 6/2019 | Whitefield |
| 2019/0189599 | A1 | 6/2019 | Baloglu et al. |
| 2019/0229101 | A1 | 7/2019 | Lee |
| 2019/0237421 | A1 | 8/2019 | Tsuchiya |
| 2019/0287953 | A1 | 9/2019 | Moon et al. |
| 2019/0288006 | A1 | 9/2019 | Paul et al. |
| 2019/0304910 | A1 | 10/2019 | Fillion |
| 2019/0304977 | A1 | 10/2019 | Costa et al. |
| 2019/0312110 | A1 | 10/2019 | Costa et al. |
| 2019/0326159 | A1 | 10/2019 | Costa et al. |
| 2019/0378819 | A1 | 12/2019 | Costa et al. |
| 2019/0378821 | A1 | 12/2019 | Costa et al. |
| 2020/0006193 | A1 | 1/2020 | Costa et al. |
| 2020/0027814 | A1 | 1/2020 | Ichiryu et al. |
| 2020/0058541 | A1 | 2/2020 | Konishi et al. |
| 2020/0115220 | A1 | 4/2020 | Hammond et al. |
| 2020/0118838 | A1 | 4/2020 | Hammond et al. |
| 2020/0176347 | A1 * | 6/2020 | Costa .................... H05K 1/021 |
| 2020/0234978 | A1 | 7/2020 | Costa et al. |
| 2020/0235024 | A1 | 7/2020 | Costa et al. |
| 2020/0235040 | A1 | 7/2020 | Costa et al. |
| 2020/0235054 | A1 | 7/2020 | Costa et al. |
| 2020/0235059 | A1 | 7/2020 | Cok et al. |
| 2020/0235066 | A1 | 7/2020 | Costa et al. |
| 2020/0235074 | A1 | 7/2020 | Costa et al. |
| 2021/0134699 | A1 | 5/2021 | Costa et al. |
| 2021/0167031 | A1 | 6/2021 | Costa et al. |
| 2021/0183693 | A1 | 6/2021 | Costa et al. |
| 2021/0188624 | A1 | 6/2021 | Costa et al. |
| 2021/0348078 | A1 | 11/2021 | Haramoto et al. |
| 2022/0285205 | A1 | 9/2022 | Chetry et al. |

FOREIGN PATENT DOCUMENTS

| | | | |
|---|---|---|---|
| CN | 101785098 | A | 7/2010 |
| CN | 101901953 | A | 12/2010 |
| CN | 102084505 | A | 6/2011 |
| CN | 102422415 | A | 4/2012 |
| CN | 102543908 | A | 7/2012 |
| CN | 102956468 | A | 3/2013 |
| CN | 103000537 | A | 3/2013 |
| CN | 103383927 | A | 11/2013 |
| CN | 103681575 | A | 3/2014 |
| CN | 103730429 | A | 4/2014 |
| CN | 103811474 | A | 5/2014 |
| CN | 103872012 | A | 6/2014 |
| CN | 104134607 | A | 11/2014 |
| CN | 106057747 | A | 10/2016 |
| CN | 106098609 | A | 11/2016 |
| CN | 106158786 | A | 11/2016 |
| CN | 107481998 | A | 12/2017 |
| CN | 108028225 | A | 5/2018 |
| CN | 108140624 | A | 6/2018 |
| CN | 110473841 | A | 11/2019 |
| DE | 102014117594 | A1 | 6/2016 |
| EP | 1098386 | A1 | 5/2001 |
| EP | 2862204 | A1 | 4/2015 |
| EP | 2996143 | A1 | 3/2016 |
| JP | S505733 | Y1 | 2/1975 |
| JP | S5338954 | A | 4/1978 |
| JP | H11-220077 | A | 8/1999 |
| JP | 200293957 | A | 3/2002 |
| JP | 2002252376 | A | 9/2002 |
| JP | 2002100767 | A | 10/2003 |
| JP | 2004273604 | A | 9/2004 |
| JP | 2004327557 | A | 11/2004 |
| JP | 2006005025 | A | 1/2006 |
| JP | 2007227439 | A | 9/2007 |
| JP | 2008235490 | A | 10/2008 |
| JP | 2008279567 | A | 11/2008 |
| JP | 2009026880 | A | 2/2009 |
| JP | 2009530823 | A | 8/2009 |
| JP | 2009200274 | A | 9/2009 |
| JP | 2009302526 | A | 12/2009 |
| JP | 2011216780 | A | 10/2011 |
| JP | 2011243596 | A | 12/2011 |
| JP | 2012129419 | A | 7/2012 |
| JP | 2012156251 | A | 8/2012 |
| JP | 2013162096 | A | 8/2013 |
| JP | 2013222745 | A | 10/2013 |
| JP | 2013254918 | A | 12/2013 |
| JP | 2014509448 | A | 4/2014 |
| TW | 201409612 | A | 3/2014 |
| TW | 201448172 | A | 12/2014 |
| TW | 201503315 | A | 1/2015 |
| TW | 201705382 | A | 2/2017 |

(56) References Cited

FOREIGN PATENT DOCUMENTS

| | | | |
|---|---|---|---|
| TW | 201719827 | A | 6/2017 |
| TW | 201724310 | A | 7/2017 |
| TW | 201733056 | A | 9/2017 |
| TW | 201738943 | A | 11/2017 |
| TW | 201826332 | A | 7/2018 |
| TW | 201834084 | A | 9/2018 |
| TW | 201835971 | A | 10/2018 |
| TW | 201839858 | A | 11/2018 |
| TW | 201839870 | A | 11/2018 |
| WO | 2007074651 | A1 | 7/2007 |
| WO | 2010080068 | A1 | 7/2010 |
| WO | 2015074439 | A1 | 5/2015 |
| WO | 2018083961 | A1 | 5/2018 |
| WO | 2018125242 | A1 | 7/2018 |
| WO | 2018168391 | A1 | 9/2018 |
| WO | 2022125722 | A1 | 6/2022 |
| WO | 2022126016 | A2 | 6/2022 |

OTHER PUBLICATIONS

Notice of Allowance for U.S. Appl. No. 16/204,214, mailed Oct. 28, 2022, 11 pages.
Final Office Action for U.S. Appl. No. 16/204,214, mailed Mar. 6, 2020, 14 pages.
Notice of Allowance for U.S. Appl. No. 16/390,496, mailed Oct. 27, 2022, 21 pages.
Notice of Allowance for U.S. Appl. No. 16/426,527, mailed Aug. 17, 2022, 7 pages.
Quayle Action for U.S. Appl. No. 16/426,527, mailed May 26, 2022, 5 pages.
Advisory Action for U.S. Appl. No. 16/427,019, mailed Jun. 2, 2022, 3 pages.
Non-Final Office Action for U.S. Appl. No. 16/427,019, mailed Aug. 15, 2022, 17 pages.
Final Office Action for U.S. Appl. No. 16/427,019, mailed Apr. 12, 2022, 15 pages.
Final Office Action for U.S. Appl. No. 16/427,019, mailed Dec. 12, 2022, 19 pages.
Corrected Notice of Allowability for U.S. Appl. No. 16/678,551, mailed Nov. 2, 2022, 3 pages.
Corrected Notice of Allowability for U.S. Appl. No. 16/678,551, mailed Mar. 9, 2022, 3 pages.
Corrected Notice of Allowability for U.S. Appl. No. 16/678,551, mailed Apr. 11, 2022, 3 pages.
Corrected Notice of Allowability for U.S. Appl. No. 16/678,551, mailed May 13, 2022, 3 pages.
Corrected Notice of Allowability for U.S. Appl. No. 16/678,551, mailed Jun. 15, 2022, 3 pages.
Corrected Notice of Allowability for U.S. Appl. No. 16/678,551, mailed Jul. 14, 2022, 3 pages.
Corrected Notice of Allowability for U.S. Appl. No. 16/678,551, mailed Sep. 2, 2022, 3 pages.
Corrected Notice of Allowability for U.S. Appl. No. 16/678,551, mailed Oct. 4, 2022, 3 pages.
Corrected Notice of Allowability for U.S. Appl. No. 16/678,602, mailed Apr. 8, 2022, 4 pages.
Corrected Notice of Allowability for U.S. Appl. No. 16/678,551, mailed Dec. 7, 2022, 3 pages.
Corrected Notice of Allowability for U.S. Appl. No. 16/678,573, mailed Jan. 27, 2022, 3 pages.
Corrected Notice of Allowability for U.S. Appl. No. 16/678,573, mailed Mar. 31, 2022, 3 pages.
Corrected Notice of Allowability for U.S. Appl. No. 16/678,573, mailed May 6, 2022, 3 pages.
Corrected Notice of Allowability for U.S. Appl. No. 16/678,573, mailed Jun. 10, 2022, 3 pages.
Advisory Action for U.S. Appl. No. 16/678,586, mailed Jan. 26, 2022, 3 pages.
Notice of Allowance and Examiner-Initiated Interview Summary for U.S. Appl. No. 16/678,586, mailed Sep. 13, 2022, 11 pages.
Non-Final Office Action for U.S. Appl. No. 16/678,586, mailed Mar. 3, 2022, 14 pages.
Final Office Action for U.S. Appl. No. 16/678,586, mailed Sep. 1, 2022, 7 pages.
Final Office Action for U.S. Appl. No. 16/678,586, mailed Nov. 22, 2021, 15 pages.
Corrected Notice of Allowability for U.S. Appl. No. 16/678,602, mailed Feb. 2, 2022, 4 pages.
Corrected Notice of Allowability for U.S. Appl. No. 16/678,602, mailed Mar. 9, 2022, 4 pages.
Corrected Notice of Allowability for U.S. Appl. No. 16/678,602, mailed May 13, 2022, 4 pages.
Corrected Notice of Allowability for U.S. Appl. No. 16/678,602, mailed Jun. 10, 2022, 4 pages.
Corrected Notice of Allowability for U.S. Appl. No. 16/678,602, mailed Jul. 14, 2022, 4 pages.
Corrected Notice of Allowability for U.S. Appl. No. 16/678,602, mailed Sep. 2, 2022, 4 pages.
Corrected Notice of Allowability for U.S. Appl. No. 16/678,602, mailed Oct. 5, 2022, 4 pages.
Corrected Notice of Allowability for U.S. Appl. No. 16/678,602, mailed Nov. 14, 2022, 4 pages.
Corrected Notice of Allowability for U.S. Appl. No. 16/678,602, mailed Nov. 24, 2021, 4 pages.
Corrected Notice of Allowability for U.S. Appl. No. 16/678,602, mailed Dec. 9, 2022, 4 pages.
Corrected Notice of Allowability for U.S. Appl. No. 16/678,602, mailed Dec. 30, 2021, 4 pages.
Non-Final Office Action for U.S. Appl. No. 16/844,406, mailed Mar. 14, 2022, 16 pages.
Non-Final Office Action for U.S. Appl. No. 17/102,957, mailed Feb. 17, 2022, 9 pages.
Notice of Allowance for U.S. Appl. No. 17/330,787, mailed Dec. 15, 2022, 7 pages.
Non-Final Office Action for U.S. Appl. No. 17/330,787, mailed Oct. 17, 2022, 10 pages.
Non-Final Office Action for U.S. Appl. No. 17/554,477, mailed Nov. 25, 2022, 6 pages.
Non-Final Office Action for U.S. Appl. No. 17/573,112, mailed Dec. 9, 2022, 6 pages.
Decision of Rejection for Chinese Patent Application No. 201680058198.6, mailed Nov. 12, 2021, 6 pages.
Summons to Attend for European Patent Application No. 16751791.1, mailed Feb. 28, 2022, 10 pages.
Examination Report for European Patent Application No. 17755402.9, mailed Dec. 20, 2021, 12 pages.
Examination Report for European Patent Application No. 17755403.7, mailed Dec. 20, 2021, 13 pages.
Reasons for Rejection for Japanese Patent Application No. 2019507767, mailed Jun. 25, 2021, 5 pages.
Non-Final Office Action for U.S. Appl. No. 15/676,693, mailed May 3, 2018, 14 pages.
Notice of Allowance for U.S. Appl. No. 15/789,107, mailed May 18, 2018, 8 pages.
Final Office Action for U.S. Appl. No. 15/616,109, mailed Apr. 19, 2018, 18 pages.
Notice of Allowance for U.S. Appl. No. 15/676,693, mailed Jul. 20, 2018, 8 pages.
Notice of Allowance for U.S. Appl. No. 15/695,629, mailed Jul. 11, 2018, 12 pages.
Notice of Allowance for U.S. Appl. No. 15/387,855, mailed Aug. 10, 2018, 7 pages.
Notice of Allowance for U.S. Appl. No. 15/914,538, mailed Aug. 1, 2018, 9 pages.
Notice of Allowance and Applicant-Initiated Interview Summary for U.S. Appl. No. 15/262,457, mailed Sep. 28, 2018, 16 pages.
Corrected Notice of Allowance for U.S. Appl. No. 15/676,693, mailed Aug. 29, 2018, 5 pages.
Final Office Action for U.S. Appl. No. 15/601,858, mailed Nov. 26, 2018, 16 pages.
Non-Final Office Action for U.S. Appl. No. 15/945,418, mailed Nov. 1, 2018, 13 pages.

(56) References Cited

OTHER PUBLICATIONS

First Office Action for Chinese Patent Application No. 201510746323.X, mailed Nov. 2, 2018, 12 pages.
Advisory Action for U.S. Appl. No. 15/601,858, mailed Jan. 22, 2019, 3 pages.
Notice of Allowance for U.S. Appl. No. 16/038,879, mailed Jan. 9, 2019, 8 pages.
Notice of Allowance for U.S. Appl. No. 16/004,961, mailed Jan. 11, 2019, 8 pages.
International Preliminary Report on Patentability for PCT/US2017/046744, mailed Feb. 21, 2019, 11 pages.
International Preliminary Report on Patentability for PCT/US2017/046758, mailed Feb. 21, 2019, 11 pages.
International Preliminary Report on Patentability for PCT/US2017/046779, mailed Feb. 21, 2019, 11 pages.
Non-Final Office Action for U.S. Appl. No. 15/992,613, mailed Feb. 27, 2019, 15 pages.
Non-Final Office Action for U.S. Appl. No. 15/695,579, mailed Jan. 28, 2019, 8 pages.
Notice of Allowance for U.S. Appl. No. 15/992,639, mailed May 9, 2019, 7 pages.
Notice of Allowance for U.S. Appl. No. 15/695,579, mailed Mar. 20, 2019, 8 pages.
Notice of Allowance for U.S. Appl. No. 16/004,961, mailed May 13, 2019, 8 pages.
Non-Final Office Action for U.S. Appl. No. 15/601,858, mailed Apr. 17, 2019, 9 pages.
Tsai, Chun-Lin, et al., "Smart GaN platform; Performance & Challenges," IEEE International Electron Devices Meeting, 2017, 4 pages.
Tsai, Szu-Ping., et al., "Performance Enhancement of Flip-Chip Packaged AlGAaN/GaN HEMTs by Strain Engineering Design," IEEE Transcations on Electron Devices, vol. 63, Issue 10, Oct. 2016, pp. 3876-3881.
Final Office Action for U.S. Appl. No. 15/992,613, mailed May 24, 2019, 11 pages.
Non-Final Office Action for U.S. Appl. No. 15/873,152, mailed May 24, 2019, 11 pages.
Notice of Allowance for U.S. Appl. No. 16/168,327, mailed Jun. 28, 2019, 7 pages.
Lin, Yueh, Chin, et al., "Enhancement-Mode GaN MIS-HEMTs With LaHfOx Gate Insulator for Power Application," IEEE Electronic Device Letters, vol. 38, Issue 8, 2017, 4 pages.
Shukla, Shishir, et al., "GaN-on-Si Switched Mode RF Power Amplifiers for Non-Constant Envelope Signals," IEEE Topical Conference on RF/Microwave Power Amplifiers for Radio and Wireless Applications, 2017, pp. 88-91.
International Search Report and Written Opinion for International Patent Application No. PCT/US19/25591, mailed Jun. 21, 2019, 7 pages.
Notice of Reasons for Refusal for Japanese Patent Application No. 2015-180657, mailed Jul. 9, 2019, 4 pages.
Notice of Allowance for U.S. Appl. No. 15/601,858, mailed Aug. 16, 2019, 8 pages.
Advisory Action for U.S. Appl. No. 15/992,613, mailed Jul. 29, 2019, 3 pages.
Final Office Action for U.S. Appl. No. 15/873,152, mailed Aug. 8, 2019, 13 pages.
Notice of Allowance for U.S. Appl. No. 15/975,230, mailed Jul. 22, 2019, 7 pages.
Notice of Allowance for U.S. Appl. No. 16/004,961, mailed Aug. 28, 2019, 8 pages.
Fiorenza, et al., "Detailed Simulation Study of a Reverse Embedded-SiGE Strained-Silicon MOSFET," IEEE Transactions on Electron Devices, vol. 55, Issue 2, Feb. 2008, pp. 640-648.
Fiorenza, et al., "Systematic study of thick strained silicon NMOSFETs for digital applications," International SiGE Technology and Device Meeting, May 2006, IEEE, 2 pages.
Huang, et al., "Carrier Mobility Enhancement in Strained Si-On-Insulator Fabricated by Wafer Bonding," Symposium on VLSI Technology, Digest of Technical Papers, 2001, pp. 57-58.
Nan, et al., "Effect of Germanium content on mobility enhancement for strained silicon FET," Student Conference on Research and Development, Dec. 2017, IEEE, pp. 154-157.
Sugii, Nobuyuki, et al., "Performance Enhancement of Strained-Si MOSFETs Fabricated on a Chemical-Mechanical-Polished SIGE Substrate," IEEE Transactions on Electron Devices, vol. 49, Issue 12, Dec. 2002, pp. 2237-2243.
Yin, Haizhou, et al., "Fully-depleted Strained-Si on Insulator NMOSFETs without Relaxed SiGe Buffers," International Electron Devices Meeting, Dec. 2003, San Francisco, California, IEEE, 4 pages.
Corrected Notice of Allowability for U.S. Appl. No. 15/695,579, mailed Feb. 5, 2020, 5 pages.
Notice of Allowance for U.S. Appl. No. 15/992,613, mailed Sep. 23, 2019, 7 pages.
Non-Final Office Action for U.S. Appl. No. 16/204,214, mailed Oct. 9, 2019, 15 pages.
Non-Final Office Action for U.S. Appl. No. 15/816,637, mailed Oct. 31, 2019, 10 pages.
Advisory Action for U.S. Appl. No. 15/873,152, mailed Oct. 11, 2019, 3 pages.
Notice of Allowance for U.S. Appl. No. 15/873,152, mailed Dec. 10, 2019, 9 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.
Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Fully Sintered Ferrite Powders," Powder Processing and Technology, LLC, Date Unknown, 1 page.

(56) References Cited

OTHER PUBLICATIONS

Author Unknown, "Heat Transfer," Cool Polymers, Inc., 2006, http://www.coolpolymers.com/heattrans.html, 2 pages.
Author Unknown, "Hysol UF3808," Henkel Corporation, Technical Data Sheet, May 2013, 2 pages.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Author Unknown, "The Technology: AKHAN's Approach and Solution: The Miraj Diamond™ Platform," 2015, accessed Oct. 9, 2016, http://www.akhansemi.com/technology.html#the-miraj-diamond-platform, 5 pages.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, pp. 900-903.
Costa, J0 et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R. M. et al., "A Water-Amine-Complexing Agent System for Etching Silicon," Journal of The Electrochemical Society, vol. 114, No. 9, Sep. 1967, pp. 965-970.
Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Final Office Action for U.S. Appl. No. 16/844,406, mailed Jun. 24, 2022, 17 pages.
Advisory Action for U.S. Appl. No. 16/844,406, mailed Jul. 26, 2022, 3 pages.
Non-Final Office Action for U.S. Appl. No. 16/844,406, mailed Oct. 6, 2022, 17 pages.
Notice of Allowance for U.S. Appl. No. 17/109,935, mailed Apr. 20, 2022, 15 pages.
Corrected Notice of Allowability U.S. Appl. No. 17/109,935, mailed Jul. 1, 2022, 4 pages.
Corrected Notice of Allowability U.S. Appl. No. 17/109,935, mailed Jul. 27, 2022, 4 pages.
Corrected Notice of Allowability U.S. Appl. No. 17/109,935, mailed Sep. 14, 2022, 4 pages.
Notice of Allowance for U.S. Appl. No. 17/109,935, mailed Oct. 28, 2022, 7 pages.
Corrected Notice of Allowability for U.S. Appl. No. 17/109,935, mailed Nov. 10, 2022, 4 pages.
Corrected Notice of Allowability for U.S. Appl. No. 17/109,935, mailed Jan. 10, 2023, 4 pages.
Final Office Action for U.S. Appl. No. 17/102,957, mailed Aug. 18, 2022, 12 pages.
Advisory Action for U.S. Appl. No. 17/102,957, mailed Oct. 27, 2022, 7 pages.
Notice of Preliminary Rejection for Korean Patent Application No. 10-2018-7006660, mailed Sep. 3, 2022, 6 pages.
First Office Action for Chinese Patent Application No. 201780062516.0, mailed Nov. 2, 2022, 10 pages.

(56) References Cited

OTHER PUBLICATIONS

First Office Action for Chinese Patent Application No. 201780063121.2, mailed Nov. 23, 2022, 12 pages.
Notice of Reasons for Rejection for Japanese Patent Application No. 2022032477, mailed Oct. 3, 2022, 4 pages.
First Office Action for Chinese Patent Application No. 201780058052.6, mailed Nov. 2, 2022, 22 pages.
International Search Report and Written Opinion for International Patent Application No. PCT/US2021/063093, mailed May 4, 2022, 15 pages.
Invitation to Pay Additional Fees and Partial International Search for International Patent Application No. PCT/US2021/063094, mailed Apr. 19, 2022, 15 pages.
International Search Report and Written Opinion for International Patent Application No. PCT/US2021/063094, mailed Aug. 9, 2022, 24 pages.
International Search Report and Written Opinion for International Patent Application No. PCT/US2021/062509, mailed Mar. 29, 2022, 20 pages.
Non-Final Office Action for U.S. Appl. No. 16/426,527, mailed Feb. 9, 2023, 9 pages.
Final Office Action for U.S. Appl. No. 16/426,527, mailed May 25, 2023, 9 pages.
Notice of Allowance for U.S. Appl. No. 16/426,527, mailed Jun. 22, 2023, 8 pages.
Notice of Allowance for U.S. Appl. No. 16/427,019, mailed Mar. 10, 2023, 10 pages.
Non-Final Office Action for U.S. Appl. No. 16/678,551, mailed Mar. 28, 2023, 14 pages.
Final Office Action for U.S. Appl. No. 16/678,551, mailed May 26, 2023, 16 pages.
Notice of Allowance for U.S. Appl. No. 17/573,112, mailed Mar. 8, 2023, 8 pages.
Notice of Allowance for U.S. Appl. No. 17/554,477, mailed Mar. 7, 2023, 8 pages.
Final Office Action for U.S. Appl. No. 16/844,406, mailed Mar. 6, 2023, 13 pages.
Advisory Action for U.S. Appl. No. 16/844,406, mailed May 12, 2023, 3 pages.
Non-Final Office Action for U.S. Appl. No. 16/844,406, mailed Jun. 23, 2023, 18 pages.
Corrected Notice of Allowability for U.S. Appl. No. 17/109,935, mailed Mar. 1, 2023, 4 pages.
Corrected Notice of Allowability for U.S. Appl. No. 17/109,935, mailed Apr. 12, 2023, 4 pages.
Non-Final Office Action for U.S. Appl. No. 17/121,194, mailed May 9, 2023, 22 pages.
Non-Final Office Action for U.S. Appl. No. 17/102,957, mailed Apr. 13, 2023, 24 pages.
Non-Final Office Action for U.S. Appl. No. 17/389,977, mailed Mar. 28, 2023, 10 pages.
Written Decision on Registration for Korean Patent Application No. 10-2018-7006660, mailed Feb. 24, 2023, 8 pages.
Decision to Grant for Japanese Patent Application No. 2022032477, mailed Mar. 14, 2023, 5 pages.
Decision of Rejection for Chinese Patent Application No. 201780058052.6, mailed Mar. 30, 2023, 16 pages.
Preliminary Examination Report for Taiwanese Patent Application No. 108140788, mailed Dec. 9, 2022, 13 pages.
Office Action for Taiwanese Patent Application No. 109102892, mailed Apr. 14, 2023, 18 pages.
Preliminary Examination Report for Taiwanese Patent Application No. 109102895, mailed May 30, 2023, 18 pages.
Preliminary Examination Report for Tawainese Patent Application No. 109102896, mailed Jul. 4, 2023, 19 pages.
Advisory Action for U.S. Appl. No. 16/678,551, mailed Jul. 28, 2023, 3 pages.
Office Action for Taiwanese Patent Application No. 108119536, mailed Jul. 13, 2023, 6 pages.
First Office Action for Chinese Patent Application No. 201980079375.2, mailed May 5, 2023, 17 pages.
Raskin, Jean-Pierre et al., "Substrate Crosstalk Reduction Using SOI Technology," IEEE Transactions on Electron Devices, vol. 44, No. 12, Dec. 1997, pp. 2252-2261.
Rong, B., et al., "Surface-Passivated High-Resistivity Silicon Substrates for RFICs," IEEE Electron Device Letters, vol. 25, No. 4, Apr. 2004, pp. 176-178.
Sherman, Lilli M., "Plastics that Conduct Heat," Plastics Technology Online, Jun. 2001, Retrieved May 17, 2016, http://www.ptonline.com/articles/plastics-that-conduct-heat, Gardner Business Media, Inc., 5 pages.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, mailed Jul. 18, 2013, 20 pages.
Final Office Action for U.S. Appl. No. 13/852,648, mailed Nov. 26, 2013, 21 pages.
Applicant-Initiated Interview Summary for U.S. Appl. No. 13/852,648, mailed Jan. 27, 2014, 4 pages.
Advisory Action for U.S. Appl. No. 13/852,648, mailed Mar. 7, 2014, 4 pages.
Notice of Allowance for U.S. Appl. No. 13/852,648, mailed Jun. 16, 2014, 9 pages.
Notice of Allowance for U.S. Appl. No. 13/852,648, mailed Sep. 26, 2014, 8 pages.
Notice of Allowance for U.S. Appl. No. 13/852,648, mailed Jan. 22, 2015, 8 pages.
Non-Final Office Action for U.S. Appl. No. 13/852,648, mailed Jun. 24, 2015, 20 pages.
Final Office Action for U.S. Appl. No. 13/852,648, mailed Oct. 22, 2015, 20 pages.
Non-Final Office Action for U.S. Appl. No. 13/852,648, mailed Feb. 19, 2016, 12 pages.
Final Office Action for U.S. Appl. No. 13/852,648, mailed Jul. 20, 2016, 14 pages.
Non-Final Office Action for U.S. Appl. No. 14/315,765, mailed Jan. 2, 2015, 6 pages.
Final Office Action for U.S. Appl. No. 14/315,765, mailed May 11, 2015, 17 pages.
Advisory Action for U.S. Appl. No. 14/315,765, mailed Jul. 22, 2015, 3 pages.
Non-Final Office Action for U.S. Appl. No. 14/260,909, mailed Mar. 20, 2015, 20 pages.
Final Office Action for U.S. Appl. No. 14/260,909, mailed Aug. 12, 2015, 18 pages.
Non-Final Office Action for U.S. Appl. No. 14/261,029, mailed Dec. 5, 2014, 15 pages.
Notice of Allowance for U.S. Appl. No. 14/261,029, mailed Apr. 27, 2015, 10 pages.
Corrected Notice of Allowability for U.S. Appl. No. 14/261,029, mailed Nov. 17, 2015, 5 pages.
Non-Final Office Action for U.S. Appl. No. 14/529,870, mailed Feb. 12, 2016, 14 pages.
Notice of Allowance for U.S. Appl. No. 14/529,870, mailed Jul. 15, 2016, 8 pages.
Non-Final Office Action for U.S. Appl. No. 15/293,947, mailed Apr. 7, 2017, 12 pages.
Notice of Allowance for U.S. Appl. No. 15/293,947, mailed Aug. 14, 2017, 7 pages.
Non-Final Office Action for U.S. Appl. No. 14/715,830, mailed Apr. 13, 2016, 16 pages.
Final Office Action for U.S. Appl. No. 14/715,830, mailed Sep. 6, 2016, 13 pages.
Advisory Action for U.S. Appl. No. 14/715,830, mailed Oct. 31, 2016, 6 pages.

(56) References Cited

OTHER PUBLICATIONS

Notice of Allowance for U.S. Appl. No. 14/715,830, mailed Feb. 10, 2017, 8 pages.
Notice of Allowance for U.S. Appl. No. 14/715,830, mailed Mar. 2, 2017, 8 pages.
Non-Final Office Action for U.S. Appl. No. 14/851,652, mailed Oct. 7, 2016, 10 pages.
Notice of Allowance for U.S. Appl. No. 14/851,652, mailed Apr. 11, 2017, 9 pages.
Corrected Notice of Allowance for U.S. Appl. No. 14/851,652, mailed Jul. 24, 2017, 6 pages.
Corrected Notice of Allowance for U.S. Appl. No. 14/851,652, mailed Sep. 6, 2017, 5 pages.
Notice of Allowance for U.S. Appl. No. 14/959,129, mailed Oct. 11, 2016, 8 pages.
Non-Final Office Action for U.S. Appl. No. 15/173,037, mailed Jan. 10, 2017, 8 pages.
Final Office Action for U.S. Appl. No. 15/173,037, mailed May 2, 2017, 13 pages.
Advisory Action for U.S. Appl. No. 15/173,037, mailed Jul. 20, 2017, 3 pages.
Notice of Allowance for U.S. Appl. No. 15/173,037, mailed Aug. 9, 2017, 7 pages.
Non-Final Office Action for U.S. Appl. No. 15/085,185, mailed Feb. 15, 2017, 10 pages.
Non-Final Office Action for U.S. Appl. No. 15/085,185, mailed Jun. 6, 2017, 5 pages.
Non-Final Office Action for U.S. Appl. No. 15/229,780, mailed Jun. 30, 2017, 12 pages.
Non-Final Office Action for U.S. Appl. No. 15/262,457, mailed Aug. 7, 2017, 10 pages.
Notice of Allowance for U.S. Appl. No. 15/408,560, mailed Sep. 25, 2017, 8 pages.
Notice of Allowance for U.S. Appl. No. 15/287,202, mailed Aug. 25, 2017, 11 pages.
Non-Final Office Action for U.S. Appl. No. 15/353,346, mailed May 23, 2017, 15 pages.
Notice of Allowance for U.S. Appl. No. 15/353,346, mailed Sep. 25, 2017, 9 pages.
Notice of Allowance for U.S. Appl. No. 16/454,809, mailed Nov. 25, 2020, 8 pages.
Non-Final Office Action for U.S. Appl. No. 16/427,019, mailed Nov. 19, 2020, 19 pages.
Non-Final Office Action for U.S. Appl. No. 16/678,573, mailed Feb. 19, 2021, 11 pages.
Non-Final Office Action for U.S. Appl. No. 16/678,602, mailed Feb. 19, 2021, 10 pages.
First Office Action for Chinese Patent Application No. 201680058198.6, mailed Dec. 29, 2020, 14 pages.
International Preliminary Report on Patentability for International Patent Application No. PCT/US2019/025591, mailed Oct. 15, 2020, 6 pages.
International Preliminary Report on Patentability for International Patent Application No. PCT/US2019/034645, mailed Jan. 14, 2021, 9 pages.
Advisory Action for U.S. Appl. No. 16/390,496, mailed Mar. 1, 2021, 3 pages.
Notice of Allowance for U.S. Appl. No. 16/390,496, mailed Apr. 5, 2021, 7 pages.
Notice of Allowance for U.S. Appl. No. 16/426,527, mailed May 14, 2021, 9 pages.
Final Office Action for U.S. Appl. No. 16/427,019, mailed May 21, 2021, 16 pages.
Non-Final Office Action for U.S. Appl. No. 16/678,551, mailed Apr. 7, 2021, 9 pages.
Final Office Action and Examiner-Initiated Interview Summary for U.S. Appl. No. 16/678,551, mailed Jun. 28, 2021, 9 pages.
Applicant-Initiated Interview Summary for U.S. Appl. No. 16/678,573, mailed May 7, 2021, 2 pages.
Final Office Action and Examiner-Initiated Interview Summary for U.S. Appl. No. 16/678,573, mailed Jun. 28, 2021, 10 pages.
Notice of Allowance for U.S. Appl. No. 16/678,619, mailed Jul. 8, 2021, 10 pages.
Final Office Action for U.S. Appl. No. 16/678,602, mailed Jun. 1, 2021, 9 pages.
Notice of Reasons for Refusal for Japanese Patent Application No. 2020119130, mailed Jun. 29, 2021, 4 pages.
Notice of Reasons for Rejection for Japanese Patent Application No. 2019507765, mailed Jun. 28, 2021, 4 pages.
Search Report for Japanese Patent Application No. 2019507768, mailed Jul. 15, 2021, 42 pages.
Notice of Reasons for Refusal for Japanese Patent Application No. 2019507768, mailed Jul. 26, 2021, 4 pages.
Supplementary Examination Report for Singapore Patent Application No. 11201901194S, mailed Mar. 10, 2021, 3 pages.
International Preliminary Report on Patentability for International Patent Application No. PCT/US2019/063460, mailed Jun. 10, 2021, 9 pages.
International Preliminary Report on Patentability for International Patent Application No. PCT/US2019/055317, mailed Apr. 22, 2021, 11 pages.
International Preliminary Report on Patentability for International Patent Application No. PCT/US2019/055321, mailed Apr. 22, 2021, 14 pages.
Office Action for Taiwanese Patent Application No. 108140788, mailed Mar. 25, 2021, 18 pages.
Corrected Notice of Allowability for U.S. Appl. No. 16/426,527, mailed Aug. 18, 2021, 4 pages.
Advisory Action for U.S. Appl. No. 16/427,019, mailed Aug. 2, 2021, 3 pages.
Non-Final Office Action for U.S. Appl. No. 16/678,586, mailed Aug. 12, 2021, 16 pages.
Notice of Allowance and Examiner-Initiated Interview Summary for U.S. Appl. No. 16/678,602, mailed Aug. 12, 2021, 11 pages.
International Preliminary Report on Patentability for International Patent Application No. PCT/US2019/034699, mailed Aug. 5, 2021, 9 pages.
International Preliminary Report on Patentability for International Patent Application No. PCT/US2020/014662, mailed Aug. 5, 2021, 11 pages.
International Preliminary Report on Patentability for International Patent Application No. PCT/US2020/014665, mailed Aug. 5, 2021, 10 pages.
International Preliminary Report on Patentability for International Patent Application No. PCT/US2020/014666, mailed Aug. 5, 2021, 11 pages.
International Preliminary Report on Patentability for International Patent Application No. PCT/US2020/014667, mailed Aug. 5, 2021, 8 pages.
International Preliminary Report on Patentability for International Patent Application No. PCT/US2020/014669, mailed Aug. 5, 2021, 9 pages.
Advisory Action and Examiner-Initiated Interview Summary for U.S. Appl. No. 16/678,551, mailed Sep. 13, 2021, 3 pages.
Notice of Allowance and Examiner-Initiated Interview Summary for U.S. Appl. No. 16/678,551, mailed Oct. 21, 2021, 8 pages.
Advisory Action and Examiner-Initiated Interview Summary for U.S. Appl. No. 16/678,573, mailed Sep. 10, 2021, 3 pages.
Notice of Allowance and Examiner-Initiated Interview Summary for U.S. Appl. No. 16/678,573, mailed Oct. 21, 2021, 7 pages.
Corrected Notice of Allowability for U.S. Appl. No. 16/678,602, mailed Aug. 26, 2021, 4 pages.
Decision to Grant for Japanese Patent Application No. 2020119130, mailed Sep. 7, 2021, 4 pages.
Second Office Action for Chinese Patent Application No. 201680058198.6, mailed Sep. 8, 2021, 8 pages.
Borel, S et al., "Control of Selectivity between SiGe and Si in Isotropic Etching Processes," Japanese Journal of Applied Physics, vol. 43, No. 6B, 2004, pp. 3964-3966.
Non-Final Office Action for U.S. Appl. No. 16/426,527, mailed Feb. 16, 2022, 9 pages.

(56) References Cited

OTHER PUBLICATIONS

Non-Final Office Action for U.S. Appl. No. 16/427,019, mailed Dec. 2, 2021, 17 pages.
Corrected Notice of Allowability for U.S. Appl. No. 16/678,551, mailed Nov. 24, 2021, 3 pages.
Corrected Notice of Allowability for U.S. Appl. No. 16/678,551, mailed Jan. 27, 2022, 3 pages.
Corrected Notice of Allowability for U.S. Appl. No. 16/678,573, mailed Nov. 24, 2021, 3 pages.
Notice of Allowance for Japanese Patent Application No. 2019507767, mailed Jan. 19, 2022, 6 pages.
Decision to Grant for Japanese Patent Application No. 2019507768, mailed Feb. 10, 2022, 6 pages.
International Search Report and Written Opinion for International Patent Application No. PCT/US2021/043968, mailed Nov. 19, 2021, 15 pages.
Office Letter for Taiwanese Patent Application No. 108140788, mailed Jan. 5, 2022, 16 pages.
Preliminary Examination Report for Taiwanese Patent Application No. 109102894, mailed Apr. 7, 2023, 20 pages.
Notice of Preliminary Rejection for Korean Patent Application No. 1020217026777, mailed Jul. 28, 2023, 12 pages.
Non-Final Office Action for U.S. Appl. No. 16/527,702, mailed Jan. 10, 2020, 10 pages.
Office Action for Japanese Patent Application No. 2018-526613, mailed Nov. 5, 2019, 8 pages.
Intention to Grant for European Patent Application No. 17757646.9, mailed Feb. 27, 2020, 55 pages.
International Search Report and Written Opinion for International Patent Application No. PCT/US2019/034645, mailed Sep. 19, 2019, 14 pages.
International Search Report and Written Opinion for International Patent Application No. PCT/US2019/063460, mailed Feb. 25, 2020, 14 pages.
International Search Report and Written Opinion for International Patent Application No. PCT/US2019/055317, mailed Feb. 6, 2020, 17 pages.
International Search Report and Written Opinion for International Patent Application No. PCT/US2019/055321, mailed Jan. 27, 2020, 23 pages.
International Search Report and Written Opinion for International Patent Application No. PCT/US2019/034699, mailed Oct. 29, 2019, 13 pages.
Corrected Notice of Allowability for U.S. Appl. No. 15/695,579, mailed Apr. 1, 2020, 4 pages.
Notice of Allowance for U.S. Appl. No. 15/816,637, mailed Apr. 2, 2020, 8 pages.
Notice of Allowance for U.S. Appl. No. 16/527,702, mailed Apr. 9, 2020, 8 pages.
Decision of Rejection for Japanese Patent Application No. 2015-180657, mailed Mar. 17, 2020, 4 pages.
Dhar, S. et al., "Electron Mobility Model for Strained-Si Devices," IEEE Transactions on Electron Devices, vol. 52, No. 4, Apr. 2005, IEEE, pp. 527-533.
Notice of Allowance for U.S. Appl. No. 16/038,879, mailed Apr. 15, 2020, 9 pages.
Notice of Allowance for U.S. Appl. No. 16/004,961, mailed Apr. 30, 2020, 8 pages.
Advisory Action for U.S. Appl. No. 16/204,214, mailed Apr. 15, 2020, 3 pages.
Examination Report for European Patent Application No. 16751791.1, mailed Apr. 30, 2020, 15 pages.
Notification of Reasons for Refusal for Japanese Patent Application No. 2018-526613, mailed May 11, 2020, 5 pages.
Notice of Allowance for U.S. Appl. No. 15/873,152, mailed May 11, 2020, 8 pages.
Non-Final Office Action for U.S. Appl. No. 16/454,687, mailed May 15, 2020, 14 pages.
Welser, J. et al., "Electron Mobility Enhancement in Strained-Si N-Type Metal-Oxide-Semiconductor Field-Effect Transistors," IEEE Electron Device Letters, vol. 15, No. 3, Mar. 1994, IEEE, pp. 100-102.
Zeng, X. et al., "A Combination of Boron Nitride Nanotubes and Cellulose Nanofibers for the Preparation of a Nanocomposite with High Thermal Conductivity," ACS Nano, vol. 11, No. 5, 2017, American Chemical Society, pp. 5167-5178.
Quayle Action for U.S. Appl. No. 16/703,251, mailed Jun. 26, 2020, 5 pages.
Corrected Notice of Allowability for U.S. Appl. No. 15/695,579, mailed May 20, 2020, 4 pages.
Notice of Allowability for U.S. Appl. No. 15/695,579, mailed Jun. 25, 2020, 4 pages.
Notice of Allowance for U.S. Appl. No. 16/368,210, mailed Jun. 17, 2020, 10 pages.
Non-Final Office Action for U.S. Appl. No. 16/374,125, mailed Jun. 26, 2020, 12 pages.
Non-Final Office Action for U.S. Appl. No. 16/390,496, mailed Jul. 10, 2020, 17 pages.
Non-Final Office Action for U.S. Appl. No. 16/204,214, mailed May 19, 2020, 15 pages.
Non-Final Office Action for U.S. Appl. No. 16/454,809, mailed May 15, 2020, 12 pages.
Examination Report for Singapore Patent Application No. 11201901193U, mailed May 26, 2020, 6 pages.
International Search Report and Written Opinion for International Patent Application No. PCT/US2020/014662, mailed May 7, 2020, 18 pages.
International Search Report and Written Opinion for International Patent Application No. PCT/US2020/014665, mailed May 13, 2020, 17 pages.
International Search Report and Written Opinion for International Patent Application No. PCT/US2020/014666, mailed Jun. 4, 2020, 18 pages.
International Search Report and Written Opinion for International Patent Application No. PCT/US2020/014667, mailed May 18, 2020, 14 pages.
International Search Report and Written Opinion for International Patent Application No. PCT/US2020/014669, mailed Jun. 4, 2020, 15 pages.
Notice of Allowance for U.S. Appl. No. 16/454,687, mailed Aug. 14, 2020, 7 pages.
Decision to Grant for Japanese Patent Application No. 2018-526613, mailed Aug. 17, 2020, 5 pages.
Final Office Action for U.S. Appl. No. 16/454,809, mailed Aug. 21, 2020, 12 pages.
Von Trapp, F., "Hybrid Bonding: From Concept to Commercialization," Apr. 2, 2018, 3D InCities, https://www.3dincites.com/2018/04/hybrid-bonding-from-concept-to-commercialization/, 10 pages.
Notice of Allowance for U.S. Appl. No. 16/703,251, mailed Aug. 27, 2020, 8 pages.
Notice of Allowance for U.S. Appl. No. 16/527,702, mailed Nov. 13, 2020, 8 pages.
Notice of Allowance for U.S. Appl. No. 16/374,125, mailed Dec. 16, 2020, 9 pages.
Final Office Action for U.S. Appl. No. 16/390,496, mailed Dec. 24, 2020, 21 pages.
Non-Final Office Action for U.S. Appl. No. 16/426,527, mailed Nov. 20, 2020, 7 pages.
Final Office Action for U.S. Appl. No. 16/204,214, mailed Nov. 30, 2020, 15 pages.
Notice of Allowance for U.S. Appl. No. 16/204,214, mailed Feb. 17, 2021, 11 pages.
Advisory Action for U.S. Appl. No. 16/454,809, mailed Oct. 23, 2020, 3 pages.
Notice of Allowance for U.S. Appl. No. 16/678,551, mailed Dec. 7, 2023, 9 pages.
Corrected Notice of Allowability for U.S. Appl. No. 17/389,977, mailed Nov. 24, 2023, 5 pages.
Office Action for Taiwanese Patent Application No. 108119536, mailed Nov. 24, 2023, 22 pages.

(56) References Cited

OTHER PUBLICATIONS

Preliminary Examination Report for Taiwanese Patent Application No. 108143149, mailed Oct. 18, 2023, 30 pages.
Second Office Action for Chinese Patent Application No. 201980079375.2, mailed Nov. 21, 2023, 17 pages.
Office Action for Taiwanese Patent Application No. 109102895, mailed Nov. 30, 2023, 16 pages.
Supplemental Notice of Allowability for U.S. Appl. No. 17/306,194, mailed Apr. 2, 2024, 7 pages.
Notice of Allowance for U.S. Appl. No. 18/306,599, mailed Apr. 10, 2024, 8 pages.
Notice of Allowance and Applicant-Initiated Interview Summary for U.S. Appl. No. 16/678,602, mailed Mar. 7, 2024, 14 pages.
Notice of Allowance for Taiwanese Patent Application No. 108119536, mailed Apr. 30, 2024, 4 pages.
Second Office Action for Chinese Patent Application No. 201980077328.4, mailed Mar. 29, 2024, 14 pages.
Office Action for Taiwanese Patent Application No. 113110397, mailed May 7, 2024, 10 pages.
Notice of Preliminary Rejection for Korean Patent Application No. 1020217026747, mailed May 1, 2024, 5 pages.
Non-Final Office Action for U.S. Appl. No. 18/071,053, mailed Oct. 24, 2024, 8 pages.
Written Decision on Registration for Korean Patent Application No. 10-2021-7026777, mailed Dec. 2, 2024, 7 pages.
Office Action for Taiwanese Patent Application No. 112147727, mailed Oct. 21, 2024, 10 pages.
Office Action for Taiwanese Patent Application No. 113125663, mailed Oct. 29, 2024, 11 pages.
Notice of Allowance for U.S. Appl. No. 16/426,527, mailed Aug. 7, 2024, 9 pages.
Examination Report for Taiwanese Patent Application No. 109102896, mailed Jun. 27, 2024, 18 pages.
Notice of Allowance for U.S. Appl. No. 17/306,194, mailed Aug. 24, 2023, 10 pages.
Notice of Allowance for U.S. Appl. No. 16/390,496, mailed Aug. 24, 2023, 24 pages.
Notice of Allowance for U.S. Appl. No. 17/970,078, mailed Aug. 25, 2023, 10 pages.
Applicant-Initiated Interview Summary for U.S. Appl. No. 16/678,551, mailed Aug. 22, 2023, 7 pages.
Applicant-Initiated Interview Summary for U.S. Appl. No. 16/844,406, mailed Sep. 13, 2023, 2 pages.
Final Office Action for U.S. Appl. No. 16/844,406, mailed Sep. 28, 2023, 7 pages.
Final Office Action for U.S. Appl. No. 17/121,194, mailed Sep. 7, 2023, 24 pages.
Notice of Allowance for U.S. Appl. No. 17/389,977, mailed Aug. 16, 2023, 8 pages.
Corrected Notice of Allowability for U.S. Appl. No. 17/389,977, mailed Sep. 20, 2023, 5 pages.
First Office Action for Chinese Patent Application No. 201980077328.4, mailed Aug. 28, 2023, 15 pages.
Notice of Allowance for U.S. Appl. No. 15/287,273, mailed Jun. 30, 2017, 8 pages.
Corrected Notice of Allowability for U.S. Appl. No. 15/287,273, mailed Jul. 21, 2017, 5 pages.
Supplemental Notice of Allowability for U.S. Appl. No. 15/287,273, mailed Sep. 7, 2017, 5 pages.
Extended European Search Report for European Patent Application No. 15184861.1, mailed Jan. 25, 2016, 6 pages.
Office Action of the Intellectual Property Office for Taiwanese Patent Application No. 104130224, mailed Jun. 15, 2016, 9 pages.
Non-Final Office Action for U.S. Appl. No. 14/885,202, mailed Apr. 14, 2016, 5 pages.
Final Office Action for U.S. Appl. No. 14/885,202, mailed Sep. 27, 2016, 7 pages.
Advisory Action for U.S. Appl. No. 14/885,202, mailed Nov. 29, 2016, 3 pages.
Notice of Allowance for U.S. Appl. No. 14/885,202, mailed Jan. 27, 2017, 7 pages.
Notice of Allowance for U.S. Appl. No. 14/885,202, mailed Jul. 24, 2017, 8 pages.
Notice of Allowance for U.S. Appl. No. 14/885,243, mailed Aug. 31, 2016, 8 pages.
Non-Final Office Action for U.S. Appl. No. 12/906,689, mailed May 27, 2011, 13 pages.
Non-Final Office Action for U.S. Appl. No. 12/906,689, mailed Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
International Search Report and Written Opinion for PCT/US2016/045809, mailed Oct. 7, 2016, 11 pages.
Non-Final Office Action for U.S. Appl. No. 15/652,867, mailed Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
International Search Report and Written Opinion for PCT/US2017/046744, mailed Nov. 27, 2017, 17 pages.
International Search Report and Written Opinion for PCT/US2017/046758, mailed Nov. 16, 2017, 19 pages.
International Search Report and Written Opinion for PCT/US2017/046779, mailed Nov. 29, 2017, 17 pages.
Non-Final Office Action for U.S. Appl. No. 15/616,109, mailed Oct. 23, 2017, 16 pages.
Corrected Notice of Allowability for U.S. Appl. No. 14/851,652, mailed Oct. 20, 2017, 5 pages.
Final Office Action for U.S. Appl. No. 15/262,457, mailed Dec. 19, 2017, 12 pages.
Supplemental Notice of Allowability and Applicant-Initiated Interview Summary for U.S. Appl. No. 15/287,273, mailed Oct. 18, 2017, 6 pages.
Supplemental Notice of Allowability for U.S. Appl. No. 15/287,273, mailed Nov. 2, 2017, 5 pages.
Non-Final Office Action for U.S. Appl. No. 15/491,064, mailed Jan. 2, 2018, 9 pages.
Notice of Allowance for U.S. Appl. No. 14/872,910, mailed Nov. 17, 2017, 11 pages.
Notice of Allowance for U.S. Appl. No. 15/648,082, mailed Nov. 29, 2017, 8 pages.
Non-Final Office Action for U.S. Appl. No. 15/652,826, mailed Nov. 3, 2017, 5 pages.
Notice of Allowance for U.S. Appl. No. 15/229,780, mailed Oct. 3, 2017, 7 pages.
Supplemental Notice of Allowability for U.S. Appl. No. 15/287,273, mailed Jan. 17, 2018, 5 pages.
Notice of Allowance for U.S. Appl. No. 15/498,040, mailed Feb. 20, 2018, 8 pages.
Non-Final Office Action for U.S. Appl. No. 15/387,855, mailed Jan. 16, 2018, 7 pages.
Non-Final Office Action for U.S. Appl. No. 15/795,915, mailed Feb. 23, 2018, 6 pages.
International Preliminary Report on Patentability for PCT/US2016/045809, mailed Feb. 22, 2018, 8 pages.
Advisory Action and Applicant-Initiated Interview Summary for U.S. Appl. No. 15/262,457, mailed Feb. 28, 2018, 5 pages.
Supplemental Notice of Allowability for U.S. Appl. No. 15/287,273, mailed Feb. 23, 2018, 5 pages.
Non-Final Office Action for U.S. Appl. No. 15/676,415, mailed Mar. 27, 2018, 14 page.

(56) References Cited

OTHER PUBLICATIONS

Non-Final Office Action for U.S. Appl. No. 15/676,621, mailed Mar. 26, 2018, 16 pages.
Notice of Allowance for U.S. Appl. No. 15/795,915, mailed Jun. 15, 2018, 7 pages.
Final Office Action for U.S. Appl. No. 15/387,855, mailed May 24, 2018, 9 pages.
Non-Final Office Action for U.S. Appl. No. 15/262,457, mailed Apr. 19, 2018, 10 pages.
Notice of Allowance for U.S. Appl. No. 15/491,064, mailed Apr. 30, 2018, 9 pages.
Non-Final Office Action for U.S. Appl. No. 15/601,858, mailed Jun. 26, 2018, 12 pages.
Notice of Allowance for U.S. Appl. No. 15/616,109, mailed Jul. 2, 2018, 7 pages.
Notice of Allowance for U.S. Appl. No. 15/676,621, mailed Jun. 5, 2018, 8 pages.
Preliminary Examination Report for Taiwanese Patent Application No. 108143149, mailed May 15, 2024, 20 pages.
Notice of Allowance for U.S. Appl. No. 16/426,527, mailed Jan. 22, 2024, 10 pages.
Non-Final Office Action for U.S. Appl. No. 18/306,599, mailed Jan. 22, 2024, 11 pages.
Notice of Allowance for U.S. Appl. No. 17/389,977, mailed Jan. 18, 2024, 17 pages.
Board Opinion for Chinese Patent Application No. 201780058052.6, mailed Jan. 15, 2024, 28 pages.
Reasons for Rejection for Taiwanese Patent Application No. 109102896, mailed Dec. 13, 2023, 17 pages.
Notice of Allowance for U.S. Appl. No. 18/151,235, mailed May 29, 2024, 22 pages.
Notice of Allowance for U.S. Appl. No. 17/102,957, mailed Jun. 25, 2024, 11 pages.
Notice of Preliminary Rejection for Korean Patent Application No. 1020217026777, mailed Apr. 23, 2024, 15 pages.
Notice of Preliminary Rejection for Korean Patent Application No. 1020217026784, mailed May 28, 2024, 13 pages.
Notice of Preliminary Rejection for Korean Patent Application No. 1020217026776, mailed May 20, 2024, 4 pages.
Notice of Preliminary Rejection for Korean Patent Application No. 1020217026748, mailed May 22, 2024, 15 pages.
Notice of Preliminary Rejection for Korean Patent Application No. 1020217026781, mailed May 29, 2024, 13 pages.
Corrected Notice of Allowability for U.S. Appl. No. 17/102,957, mailed Jul. 10, 2024, 7 pages.
Quayle Action for U.S. Appl. No. 16/678,551, mailed Oct. 4, 2023, 6 pages.
Non-Final Office Action for U.S. Appl. No. 16/678,602, mailed Oct. 6, 2023, 18 pages.
Notice of Allowance for for U.S. Appl. No. 16/844,406, mailed, Nov. 16, 2023, 11 pages.
Notice of Allowance for U.S. Appl. No. 17/121,194, mailed Oct. 23, 2023, 8 pages.
Final Office Action for U.S. Appl. No. 17/102,957, mailed Oct. 26, 2023, 27 pages.
Corrected Notice of Allowability for U.S. Appl. No. 17/389,977, mailed Oct. 25, 2023, 5 pages.
Board Opinion for Chinese Patent Application No. 201780058052.6, mailed Oct. 8, 2023, 15 pages.
First Office Action for Chinese Patent Application No. 201980050433.9, mailed Sep. 4, 2023, 20 pages.
First Office Action for Chinese Patent Application No. 201980090320.1, mailed Sep. 5, 2023, 11 pages.
Office Action for Taiwanese Patent Application No. 109102892, mailed Sep. 13, 2023, 18 pages.
Preliminary Examination Report for Taiwanese Patent Application No. 109102893, mailed Sep. 7, 2023, 10 pages.
First Office Action for Chinese Patent Application No. 202180081682.1, mailed May 25, 2026, 23 pages.

* cited by examiner

FRONT-END MODULE WITH VERTICALLY STACKED DIE AND CIRCULATOR

RELATED APPLICATIONS

This application is a 35 USC 371 national phase filing of International Application No. PCT/US2021/063093, filed Dec. 13, 2021, which claims the benefit of provisional patent application Ser. No. 63/124,440, filed Dec. 11, 2020, the disclosures of which are incorporated herein by reference in their entireties.

FIELD OF THE DISCLOSURE

The present disclosure relates to a front-end module (FEM) and a process for making the same, and more particularly to an FEM that includes a die and a circulator stacked vertically with the die, and a process for forming the circulator vertically stacked with the die by utilizing elements in the die.

BACKGROUND

A front-end module (FEM) is a very important component in radio frequency (RF) applications, which incorporates all the circuitry between an antenna and at least one mixing stage of a receiver (RX) and a transmitter (TX). Typically, the FEM may include acoustic duplexers to isolate the RX path and the TX path. However, for ultra-high frequency applications (e.g., mmWave applications), the acoustic duplexers are no longer viable. In such cases, circulators are introduced for isolation purposes.

Traditional circulators have assembly processes that are not compatible with existing FEM processes. As such, it is very challenging to integrate the traditional circulators into today's FEMs. In addition, the traditional circulators tend to have very large dimensions and in particular large heights, which cannot meet current low-profile requirements of portable communication devices.

Accordingly, there remains a need for improved FEM designs that include a circulator for signal isolation in the ultra-high frequency applications, where manufacturing the circulator can be compatible with the FEM processes without sacrificing footage/height of the final products.

SUMMARY

The present disclosure describes a front-end module (FEM) that includes a die and a circulator stacked vertically with the die, and a process for making the same. In the disclosed FEM, a thinned flip-chip die, which resides over a module carrier, includes a device region with a metal layer, an insulating layer over a top surface of the device region, and a number of interconnects extending from a bottom surface of the device region to the module carrier. A first mold compound also resides over the module carrier, surrounds the thinned flip-chip die, and extends beyond a top surface of the thinned flip-chip die to define an opening over the top surface of the thinned flip-chip die, where the first mold compound provides vertical walls of the opening. A ferrimagnetic portion resides over the top surface of the thinned flip-chip die and within the opening, and a permanent magnetic portion resides over the ferrimagnetic portion and within the opening. Herein, the permanent magnetic portion, the ferrimagnetic portion, and the metal layer of the device region are vertically aligned. A combination of the permanent magnetic portion, the ferrimagnetic portion, and the metal layer of the device region provides a circulator vertically stacked with the thinned flip-chip die.

In one embodiment of the FEM, the metal layer in the device region has a thickness between fractions of a micrometer and several tens of micrometers, and has a horizontal area between several hundreds of micrometer-square and several millimeter-square.

In one embodiment of the FEM, the thinned flip-chip die is an active die. The device region includes an active layer and a back-end-of-line (BEOL) portion underneath the active layer, where the active layer is configured to provide one or more active devices, and the BEOL portion includes the metal layer and is configured to provide one or more integrated passive devices.

In one embodiment of the FEM, the metal layer in the BEOL includes at least three ports. Herein, the one or more integrated passive devices includes one or more passive filters and one or more programmable capacitors. Each of the one or more integrated passive devices is connected to a corresponding port of the at least three ports.

In one embodiment of the FEM, the thinned flip-chip die is formed from a silicon-on-insulator (SOI) structure. The active layer of the thinned flip-chip die is formed by integrating the one or more active devices in or on a silicon epitaxy layer of the SOI structure, and the insulating layer of the thinned flip-chip die is a buried oxide layer of the SOI structure.

In one embodiment of the FEM, the thinned flip-chip die is a passive die, where the device region includes a BEOL portion, which includes the metal layer and is configured to provide one or more integrated passive devices.

In one embodiment of the FEM, the insulating layer of the thinned flip-chip die includes at least one of a dielectric material and a polymer composite material, such as silicon dioxide, silicon nitride, emulation polymers, liquid crystal polymers, interlayer polymers, and synthetic rubber.

In one embodiment of the FEM, the ferrimagnetic portion includes one or more ferrites, such as magnetite $Fe_3O_4$, yttrium iron garnet (YIG), $PbFe_{12}O_{19}$, $BaFe_{12}O_{19}$, pyrrhotite, $Fe_{1-x}S$, and iron oxides with aluminum, cobalt, nickel, manganese, and zinc. The ferrimagnetic portion has a thickness between few micrometers and several hundreds of micrometers, and has a horizontal shape of a circle, a square, a hexagon, a rectangle, or a high order polygon.

In one embodiment of the FEM, the permanent magnetic portion is formed of one or more materials that are magnetized and creates their own persistent magnetic field, such as iron, nickel, cobalt, and their alloys, alloys of rare-earth metals, and lodestone. The permanent magnetic portion has a thickness between few micrometers and several hundreds of micrometers, and a horizontal shape of a circle, a square, a hexagon, a rectangle, or a high order polygon.

In one embodiment of the FEM, the ferrimagnetic portion and the permanent magnetic portion have same horizontal dimensions as the opening.

According to one embodiment, the FEM further includes a second mold compound residing over the permanent magnetic portion to encapsulate the circulator.

According to one embodiment, the FEM further includes an underfilling layer that resides over a top surface of the module carrier and fills gaps between the bottom surface of the device region of the thinned flip-chip die and the top surface of the module carrier, such that the interconnects is encapsulated by the underfilling layer. Herein, the first mold compound resides over the underfilling layer.

In one embodiment of the FEM, the ferrimagnetic portion has same horizontal dimensions as the opening, and the permanent magnetic portion has smaller horizontal dimensions than the opening, such that a top surface of the ferrimagnetic portion is partially exposed through the permanent magnetic portion.

According to one embodiment, the FEM further includes a second mold compound residing over the top surface of the ferrimagnetic portion and fully encapsulating the permanent magnetic portion.

According to one embodiment, the FEM further includes an alignment material and a second mold compound. Herein, the alignment material resides over the top surface of the ferrimagnetic portion and surrounds the permanent magnetic portion, where a combination of the permanent magnetic portion and the alignment material has same horizontal dimensions as the opening. The second mold compound resides over the combination of the permanent magnetic portion and the alignment material to encapsulate the circulator.

In one embodiment of the FEM, the ferrimagnetic portion has smaller horizontal dimensions than the opening, such that the top surface of the thinned flip-chip die is partially exposed through the ferrimagnetic portion. The permanent magnetic portion has same horizontal dimensions as the opening.

According to one embodiment, the FEM further includes a second mold compound and a third mold compound. Herein, the third mold compound has a dielectric constant higher than 10, and resides over the top surface of the thinned flip-chip die and fills gaps laterally between the ferrimagnetic portion and the vertical walls of the opening. The second mold compound resides over the permanent magnetic portion to encapsulate the circulator.

In one embodiment of the FEM, the ferrimagnetic portion has smaller horizontal dimensions than the opening, and the permanent magnetic portion has smaller horizontal dimensions than the opening, such that the top surface of the thinned flip-chip die is partially exposed through the ferrimagnetic portion and the permanent magnetic portion.

According to one embodiment, the FEM further includes a second mold compound residing over the top surface of the thinned flip-chip die, and fully encapsulating the ferrimagnetic portion and the permanent magnetic portion.

According to one embodiment, the FEM further includes a second mold compound and a third mold compound. Herein, the third mold compound has a dielectric constant higher than 10, and the third mold compound resides over the top surface of the thinned flip-chip die and fills gaps laterally between the ferrimagnetic portion and the vertical walls of the opening. The second mold compound resides over the third mold compound, and fully encapsulates the permanent magnetic portion.

In one embodiment of the FEM, the metal layer in the device region has one of a "Y" shape with three ports, an "X" shape with four ports, and a "star" shape with five ports.

According to one embodiment, the FEM further includes a bonding material between the permanent magnetic portion and the ferrimagnetic portion.

According to an exemplary process, a precursor module, which includes a module carrier, an intact flip-chip die deposed over the module carrier, and a first mold compound over the module carrier and fully encapsulating the intact flip-chip die, is firstly provided. Herein, the intact flip-chip die includes a device region with a metal layer, a number of interconnects extending from a bottom surface of the device region to the module carrier, an insulating layer over a top surface of the device region, and a die substrate over the insulating layer. As such, a backside of the die substrate is a top surface of the intact flip-chip die. Next, the first mold compound is thinned down to expose the backside of the die substrate. The die substrate is then removed substantially to provide a thinned flip-chip die and define an opening over the thinned flip-chip die and within the first mold compound. A ferrimagnetic portion is deposed over a top surface of the thinned flip-chip die and within the opening. A permanent magnetic portion is deposed over the ferrimagnetic portion and within the opening. Herein, the permanent magnetic portion, the ferrimagnetic portion, and the metal layer of the device region are vertically aligned, and a combination of the permanent magnetic portion, the ferrimagnetic portion, and the metal layer of the device region provides a circulator vertically stacked with the thinned flip-chip die.

According to one embodiment, the exemplary process further includes applying a second mold compound over the permanent magnetic portion so as to encapsulate and isolate the circulator 34 from an external environment.

In one embodiment of the exemplary process, before deposing the ferrimagnetic portion and the permanent magnetic portion, the ferrimagnetic portion and the permanent magnetic portion are bonded together via a bonding material. Herein, the ferrimagnetic portion and the ferrimagnetic portion are deposed simultaneously.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 4:
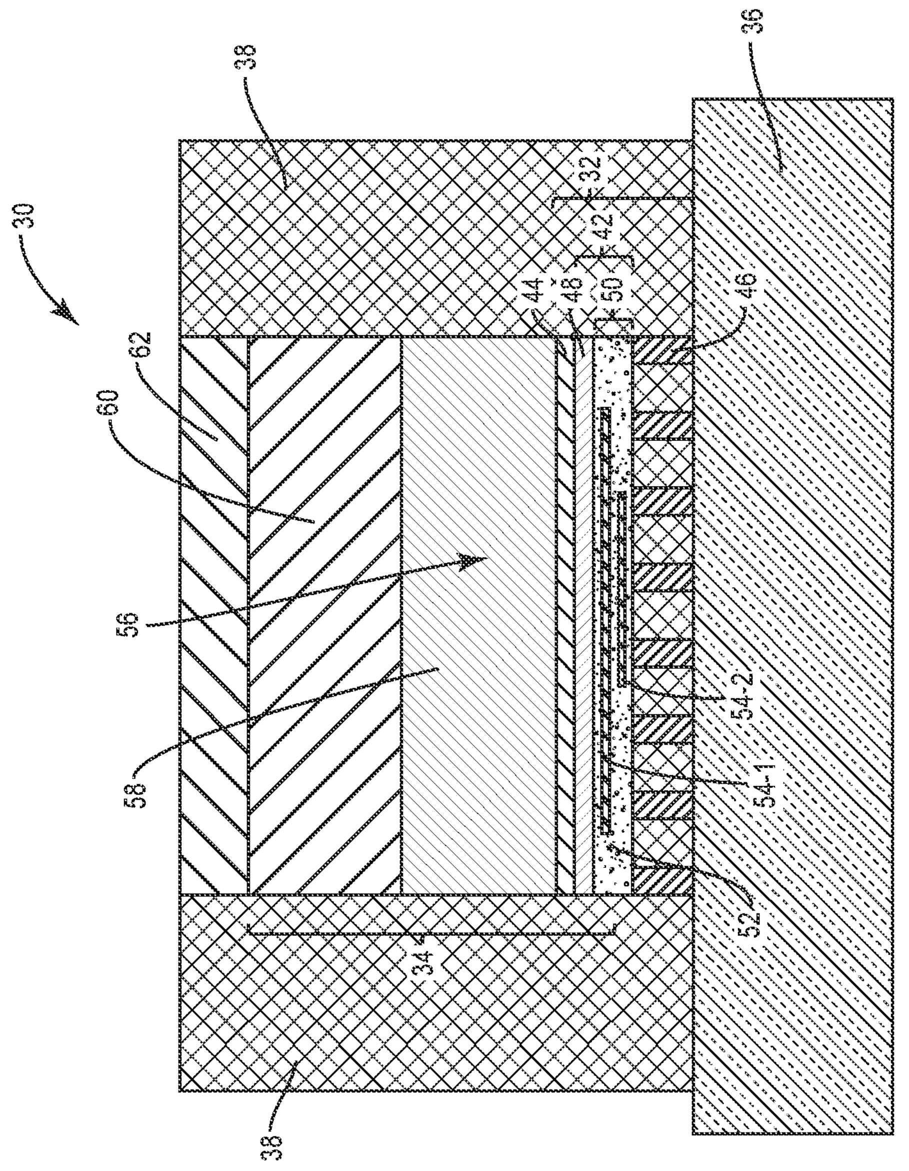
FIG. 4 shows an exemplary front-end module (FEM) that includes a thinned flip-chip die and a circulator stacked vertically with the die according to one embodiment of the present disclosure.
Figure 7:
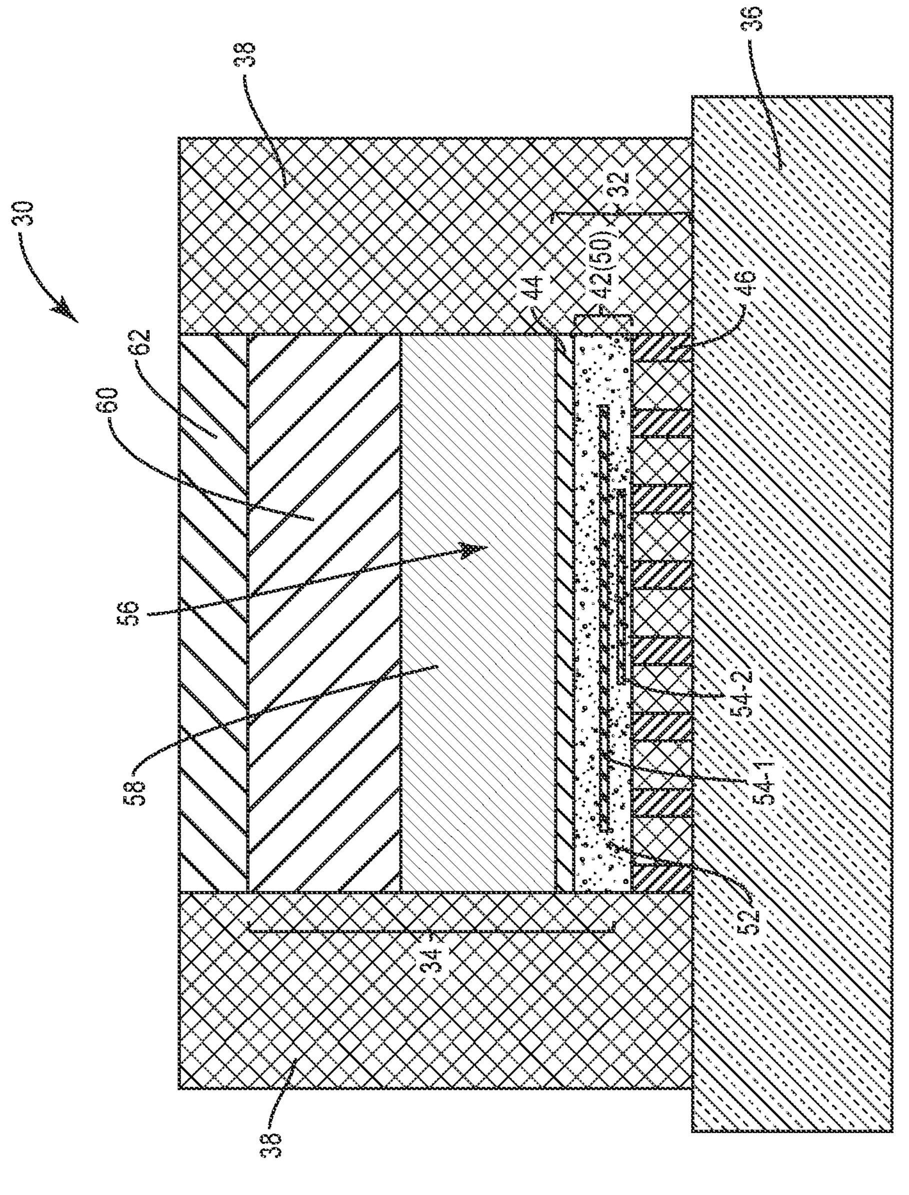
FIGS. 7-13 show an alternative FEM according to one embodiment of the present disclosure.

FIGS. 14A-19 provide exemplary steps that illustrate a process to fabricate the exemplary FEM shown in FIG. 4 or FIG. 7.

It will be understood that for clear illustrations, FIGS. 1-19 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

A circulator is a passive, non-reciprocal three, four, or multi-port device that allows a microwave or radio-frequency signal to exit through the port directly after the one it entered. By terminating one port of a three-port circulator in a matched load, it can be used as an isolator. In such case, a signal can travel in only one direction between the remaining two ports. Isolators are used to shield the input ports of a system from the effects on its output ports. One example is to provide isolation to prevent a microwave source being detuned by a mismatched load. Circulators can also be used as duplexers that route signals from the transmitter to the antenna and from the antenna to the receiver, without allowing signals to pass directly from transmitter to receiver (provide isolation between transmitter and receiver). Another circulator application is in reflection amplifiers which are a type of microwave amplifier circuit utilizing negative differential resistance diodes. A non-reciprocal component such as a circulator is needed to separate the outgoing amplified signal from the incoming input signal in the one port device (e.g. a diode has only two terminals). The output and input can be decoupled by using a 3-port circulator with the signal input connected to the first port, the biased diode connected to the second port, and the output load connected to the third port.

To realize a circulator, three types of layers are needed: one or more metal layers, one or more ferrimagnetic layers over the one or more metal layers, and one or more permanent magnetic layers over the one or more ferrimagnetic layers. The one or more metal layers may be formed of copper, aluminum, silver, gold, alloy compounds, or any combination of above. The one or more ferrimagnetic layers may be formed of one or more ferrites, such as magnetite $Fe_3O_4$, yttrium iron garnet (YIG), cubic ferrites composed of iron oxides with other elements (e.g., aluminum, cobalt, nickel, manganese, and zinc), or hexagonal ferrites (e.g., $PbFe_{12}O_{19}$ and $BaFe_{12}O_{19}$ and pyrrhotite, $Fe_{1-x}S$). The materials used in the one or more ferrimagnetic layers has populations of atoms with opposing magnetic moments and comprise of different types of atoms in the material's unit cell. For the ferrimagnetic materials, these moments are unequal in magnitude, so a spontaneous magnetization remains. The permanent magnetic layers are made from one or more materials that are magnetized and creates their own persistent magnetic field, such as iron, nickel, cobalt, and their alloys, alloys of rare-earth metals, and naturally occurring minerals (e.g., lodestone).

Figure 1:
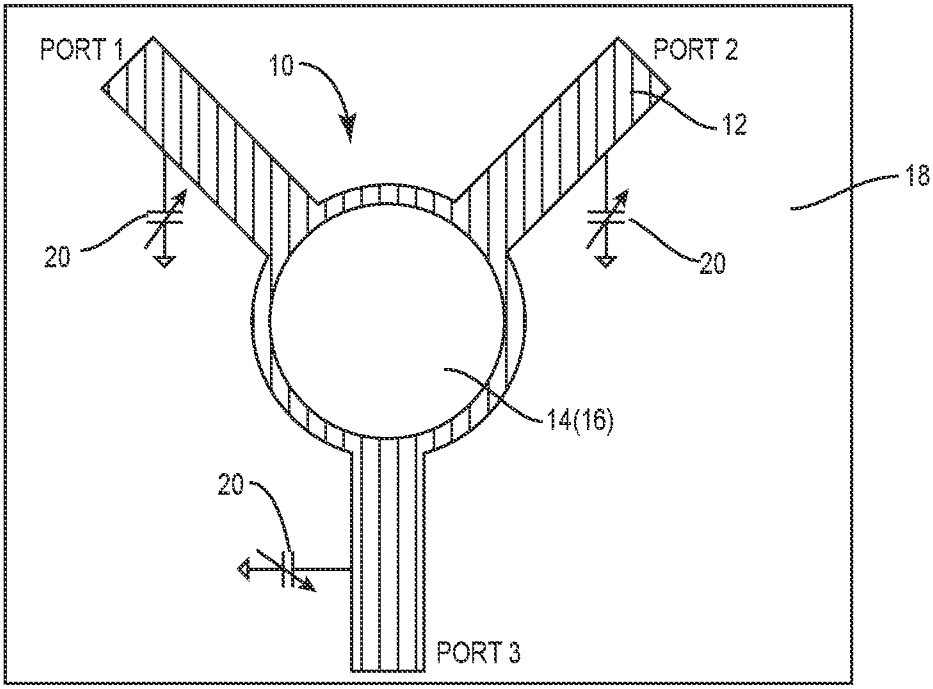
FIG. 1 shows a top view of an exemplary circulator according to one embodiment of the present disclosure.
Figure 2A:
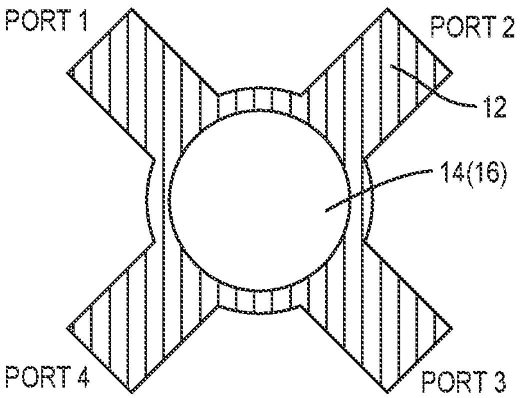
FIGS. 2A and 2B show an alternative shape of the circulator.
Figure 2B:
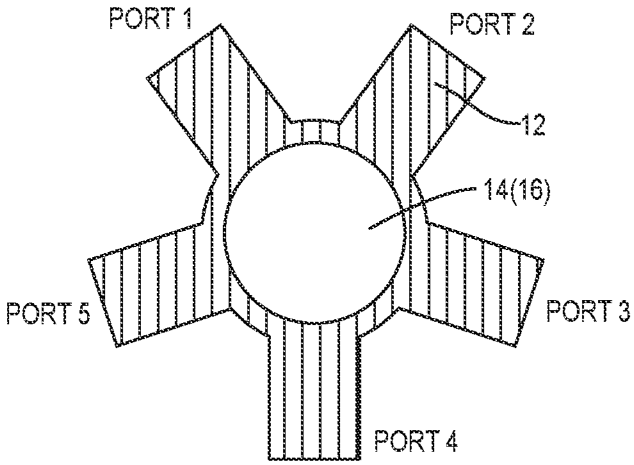

FIG. 1 shows a top view of an exemplary circulator 10. For the purpose of this illustration, the circulator 10 has a "Y"-shaped metal layer 12 with three ports (e.g., a first port PORT1, a second port PORT2, and a third port PORT3), a circle-shaped permanent magnetic portion 14 over a central portion of the metal layer 12, and a circle-shaped ferrimagnetic portion 16 vertically between the central portion of the metal layer 12 and the permanent magnetic portion 14 (cannot be seen herein). In different applications, the circulator 10, especially the metal layer 12, may have different shapes, such as an "X" shape with four ports (e.g., the first port PORT1, the second port PORT2, the third port PORT3, and a fourth port PORT4), as shown in 2A, or a star shape with five ports (e.g., the first port PORT1, the second port PORT2, the third port PORT3, the fourth port PORT4, and a fifth port PORT5) as shown in FIG. 2B. In addition, in different applications, the permanent magnetic portion 14 and the ferrimagnetic portion 16 may have different shapes and/or different horizontal sizes. For instance, the permanent magnetic portion 14 may have a square shape, while the ferrimagnetic portion 16 may have a hexagon shape (details shown below). The permanent magnetic portion 14 may have a larger or smaller horizontal size than the ferrimagnetic portion 16 (details shown below). Furthermore, the permanent magnetic portion 14 and/or the ferrimagnetic portion 16 may have a larger horizontal size than the metal layer 12 (details shown below).

The metal layer 12 in the circulator 10 may be implemented by strip-line structures or waveguide structures. In a case of strip-line implementation, a ground plane 18 (e.g., a metal plate) underneath the circulator 10 is needed. In some applications, one or more programable capacitors (PACs) 20 may be connected to one or more ports of the metal layer 12 (only one programmable capacitor 20 connected to each port of the metal layer 12 is illustrated for simplicity) to tune frequency responses of the circulator 10. Since each port is a portion of the metal layer 12, it is easy to have the PACs 20 connected at the port metal line(s) during the manufacturing process to tune the characteristics of the circulator 10.

Figure 3A:
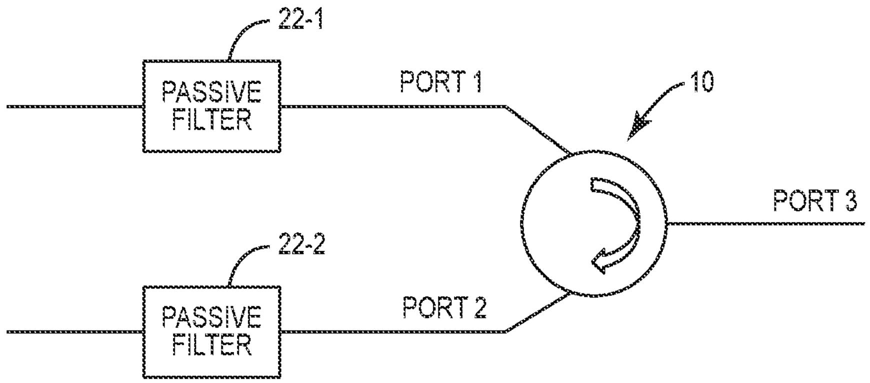
FIGS. 3A and 3B show the circulator combined with other electric components for enhanced performance.
Figure 3B:
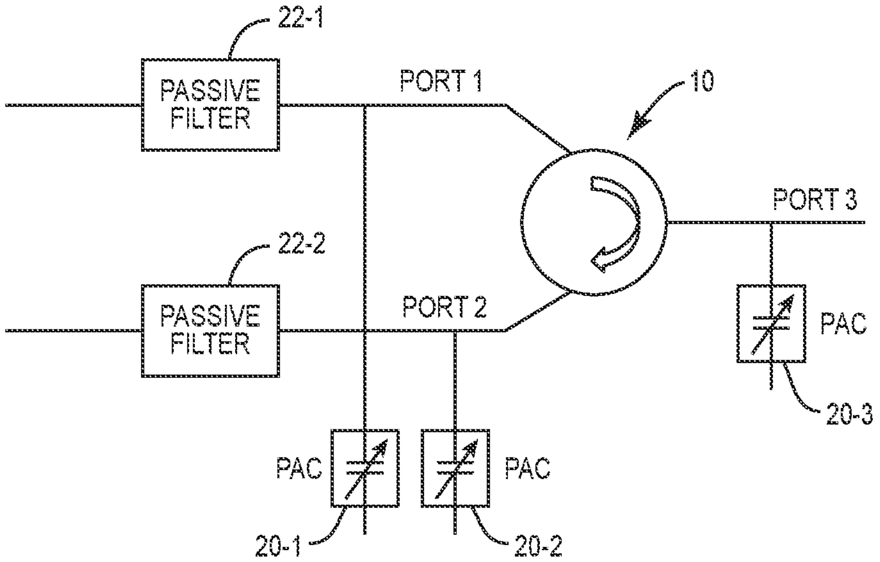

Typically, the circulator 10 can intrinsically realize a duplexing function. However, the circulator 10 itself has difficulty achieving high rejections in an order of 50 dB or more. In one embodiment, the circulator 10 may be combined with passive filters 22 to achieve a high-end duplexer function (e.g., the circulator with a 30 dB attenuation combined with the passive filters 22 with 20 dB or more attenuation can achieve a total 50 dB+ attenuation), as illustrated in FIG. 3A. Herein, a first passive filter 22-1 is connected to the first port PORT1 (e.g. for the TX path), and a second passive filter 22-2 is connected to the second port PORT2 (e.g., for the RX path). In addition, one or more PACs 20 may also be utilized to optimize the duplexer performance (i.e., performance of the combination of the circulator 10 and the passive filters 22) by providing additional frequency response tuning, as illustrated in FIG. 3B. Herein, a first PAC 20-1 is connected to the first port PORT1, a second PAC 20-2 is connected to the second port PORT2, and a third PAC 20-3 is connected to the third port PORT3. In other cases, there might not be any or there might be more PACs connected to each port of the circulator 10.

FIG. 4 shows an exemplary front-end module (FEM) 30 that includes a thinned flip-chip die 32 and a circulator 34 stacked vertically with the thinned flip-chip die 32 according to one embodiment of the present disclosure. Besides the thinned flip-chip die 32 and the circulator 34, the FEM 30 also includes a module carrier 36, which the thinned flip-chip die 32 and the circulator 34 reside over, and a first mold compound 38 surrounding the thinned flip-chip die 32 and the circulator 34.

The thinned flip-chip die 32 includes a device region 42, an insulating layer 44 over a top surface of the device region 42, and a number of interconnects 46 extending from a bottom surface of the device region 42 to the module carrier 36 (only one of the interconnects 46 is labeled with a reference number for clarity). Herein, the thinned flip-chip die 32 substantially has no die substrate, which is removed during a packing process (details shown below). In FIG. 4, the thinned flip-chip die 32 is an active die, where the device region 42 includes an active layer 48 and a back-end-of-line (BEOL) portion 50 underneath the active layer 48. Herein, the top surface of the device region 42 is a top surface of the active layer 48, and the bottom surface of the device region 42 is a bottom surface of the BEOL portion 50. The active layer 48 is configured to provide one or more active devices (e.g., devices with one or more transistors), while the BEOL portion 50 is configured to connect the active devices in the active layer 48 to each other and/or configured to connect the active devices to external components (e.g., external dies, external antennas, or etc.).

Typically, the BEOL portion 50 includes dielectric layers 52 and a multi-layer metal structure 54 within the dielectric layers 52. The multi-layer metal structure 54 is used to achieve the connection function of the BEOL 50. Herein, the multi-layer metal structure 54 includes a first metal layer 54-1 configured as a metal layer for a circulator (details described below), and may include a second metal layer 54-2 configured as a ground plane (only the first metal layer 54-1 and the second metal layer 54-2 are illustrated for the multi-layer metal structure 54 for simplicity). The first metal layer 54-1 may have a "Y" shape, an "X" shape, or a star shape as illustrated in FIGS. 1, 2A and 2B. The first metal layer 54-1 may have a thickness between fractions of a micrometer and several tens of micrometers, and has a horizontal area between hundreds of micrometer-square and several millimeter-square. Micro-circulators have smaller areas and can be used in integration with other components in modules. Traditional circulators have larger areas, from tens of millimeter-square to several centimeter-square. In some applications, the BEOL portion 50 may also be configured to provide passive devices (e.g., utilizing the dielectric layers 52 and the multi-layer metal structure 54 to form the passive devices, not shown) connected to the first metal layer 54-1, which is configured as the circulator metal layer. For instance, the BEOL portion 50 is configured to provide tuning circuits for ports of the first metal layer 54-1 (e.g., passive filters and PACs connected to the ports of the first metal layer 54-1), while the active layer 48 is configured to provide active circuits with transistors (e.g., bias circuits, digital interface circuits, and/or calibration circuits).

In one embodiment, the thinned flip-chip die 32 may be formed from a silicon-on-insulator (SOI) structure. The active layer 48 of the thinned flip-chip die 32 is formed by integrating active devices (not shown) in or on a silicon epitaxy layer of the SOI structure. The insulating layer 44 of the thinned flip-chip die 32 is a buried oxide (i.e., silicon oxide, BOX) layer of the SOI structure. In addition, a silicon substrate of the SOI structure is removed substantially from the thinned flip-chip die 32 (details described below). In some applications, a top surface of the thinned flip-chip die 32 is a top surface of the insulating layer 44. The BEOL portion 50 and the interconnects 46 are formed underneath the active layer 48 after the active layer 48 is completed. The interconnects 46 may be copper pillars or solder balls.

The first mold compound 38 resides over the module carrier 36, surrounds the thinned flip-chip die 32, and extends vertically above the top surface of the thinned flip-chip die 32 to define an opening 56 within the first mold compound 38 and over the top surface of the thinned flip-chip die 32. The top surface of the thinned flip-chip die 32 is exposed at the bottom of the opening 56. In some applications, the first mold compound further fills gaps between the bottom surface of the device region 42 and a top surface of the module carrier 36 and encapsulates each interconnect 46 of the thinned flip-chip die 32. One exemplary material used to form the first mold compound 18 is an organic epoxy resin system. Notice that the first mold compound 38 does not reside over the thinned flip-chip die 32 and provides vertical walls of the opening 56. The vertical walls of the opening 56 are well aligned with edges (i.e., sides of the device region 42) of the thinned flip-chip die 32.

A ferrimagnetic portion 58 is deposed within the opening 56 and over the top surface of the thinned flip-chip die 32 (i.e., over the top surface of the insulating layer 44), and a permanent magnetic portion 60 is deposed within the opening 56 and over the ferrimagnetic portion 58. The ferrimagnetic portion 58 may be formed of one or more ferrite materials, such as magnetite $Fe_3O_4$, YIG, cubic ferrites composed of iron oxides with other elements (e.g., aluminum, cobalt, nickel, manganese, and zinc), or hexagonal ferrites (e.g., $PbFe_{12}O_{19}$ and $BaFe_{12}O_{19}$ and pyrrhotite, $Fe_{1-x}S$). The ferrimagnetic portion 58 may have a thickness between few micrometers and several hundreds of micrometers, or even up to few millimeters. The permanent magnetic portion 60 may be formed of one or more materials that are magnetized and creates their own persistent magnetic field, such as iron, nickel, cobalt, and their alloys, alloys of rare-earth metals, and naturally occurring minerals (e.g., lodestone). The permanent magnetic portion 60 may have a thickness between few micrometers and several hundreds of micrometers, or even up to few millimeters.

Figure 5A:
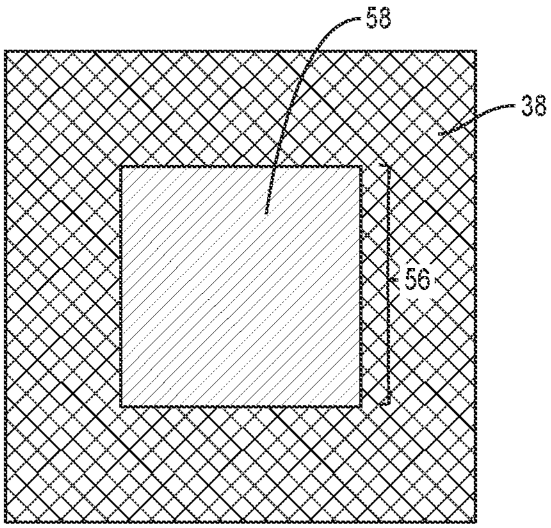
FIGS. 5A-5C show exemplary shapes of a ferrimagnetic portion of the circulator included in the FEM shown in FIG. 4.
Figure 5B:
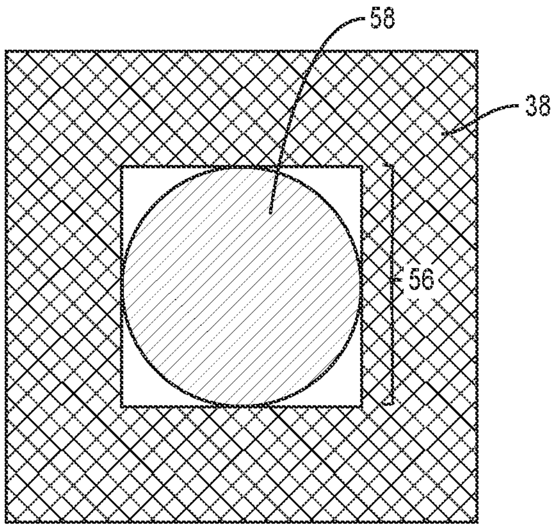
Figure 5C:
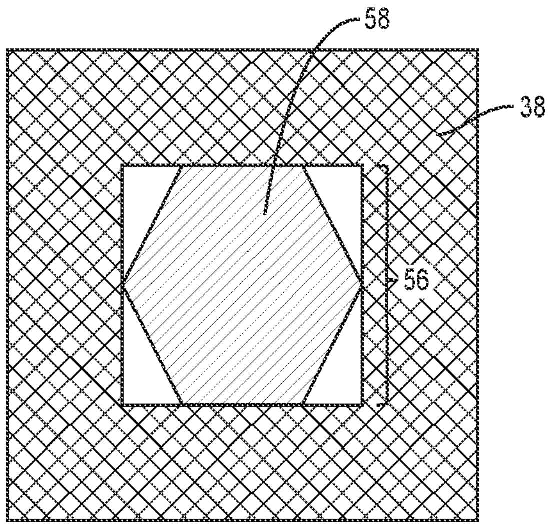
Figure 6A:
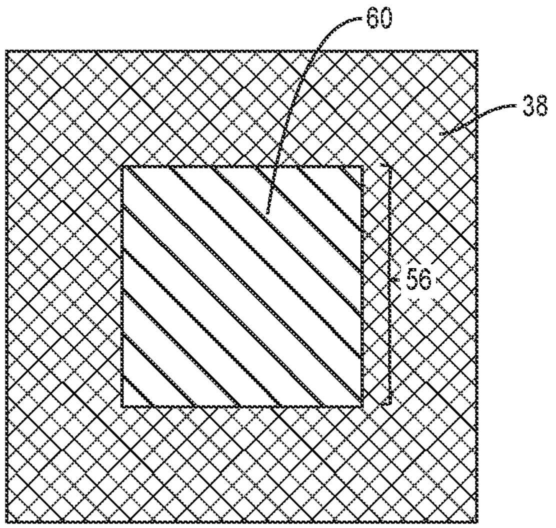
FIGS. 6A-6C show exemplary shapes of a permanent magnetic portion of the circulator included in the FEM shown in FIG. 4.
Figure 6B:
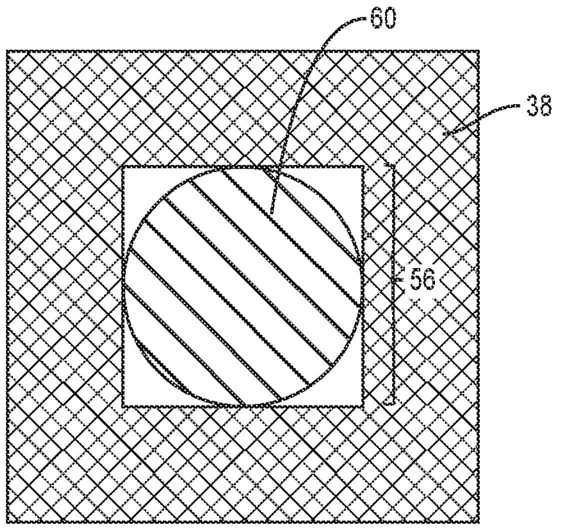
Figure 6C:
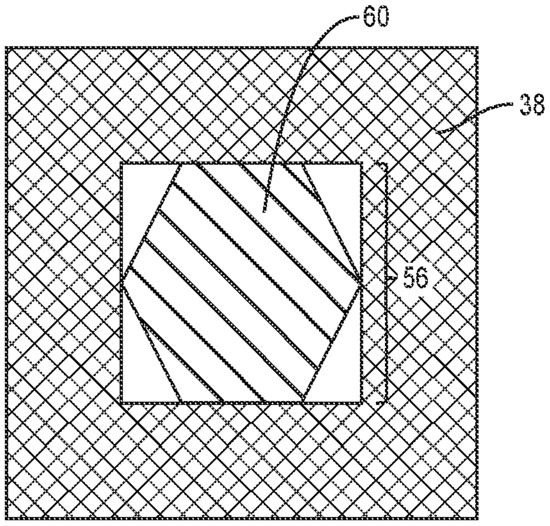

Notice that, since the vertical walls of the opening 56 are aligned with the edges of the thinned flip-chip die 32, the ferrimagnetic portion 58 and the permanent magnetic portion 60, which are deposed within the opening 56, are capable of being self-aligned with the thinned flip-chip die 32. FIGS. 5A-5C show a top view of some exemplary shapes (e.g. a rectangular/square, a circle, a hexagon, and a high order polygon) of the ferrimagnetic portion 58 for self-alignment, and FIGS. 6A-6C show a top view of some exemplary shapes (e.g. e.g. a rectangular/square, a circle, a hexagon, and a high order polygon) of the permanent magnetic portion 60 for self-alignment. In general, once the shape of the ferrimagnetic portion 58/the permanent magnetic portion 60 conforms to horizontal dimensions of the opening 56 (e.g., a diameter of the circle matches a side length of the opening 56, or a diagonal of the hexagon matches the side length of the opening 56, or a side length of the square matches the side length of the opening 56), the ferrimagnetic portion 58/the permanent magnetic portion 60 can be self-aligned with the thinned flip-chip die 32. In different applications, the ferrimagnetic portion 58 and the permanent magnetic portion 60 may have a same or different shape, and/or may have a same or different horizontal area.

As such, both the ferrimagnetic portion 58 and the permanent magnetic portion 60 can be vertically aligned with the first metal layer 54-1 in the device region 42 of the thinned flip-chip die 32. In consequence, a combination of the first metal layer 54-1 in the device region 42 of the thinned flip-chip die 32, the ferrimagnetic portion 58 over the thinned flip-chip die 32, and the permanent magnetic portion 60 over the ferrimagnetic portion 58 can provide the circulator 34, which is vertically stacked with the thinned flip-chip die 32. Herein, although the ferrimagnetic portion 58 does not directly reside over the first metal layer 54-1 in the device region 42 of the thinned flip-chip die 32 (i.e., the insulating layer 44 and portions of the device region 42 in between), a vertical distance between the ferrimagnetic portion 58 and the first metal layer 54-1 in the device region 42 of the thinned flip-chip die 32 is relatively short, no larger than couple tens of micrometers or few hundreds of micrometers.

In addition, FIG. 4 also illustrates that the FEM 30 may further include a second mold compound 62 to encapsulate the circulator 34 and isolate the circulator 34 from an external environment. For the purpose of this illustration, the second mold compound resides within the opening 56 and over the permanent magnetic portion 60. In different applications, the second mold compound 62 may extend over the first mold compound 38, may further surround the permanent magnetic portion 60, or may further surround both the permanent magnetic portion 60 and the ferrimagnetic portion 58 (details shown below). The first mold compound 38 and the second mold compound 62 may be formed of a same or different material. If the same material is used for both the first mold compound 38 and the second mold compound 62, it results in better temperature and mechanical stability because of same temperature coefficients.

In some applications, the thinned flip-chip die 32 in the FEM 30 is not an active die, but a passive die without any active layer. As illustrated in FIG. 7, the thinned flip-chip die 32 is a passive die, where the device region 42 of the thinned flip-chip die 32 does not include the active layer 48 but only includes the BEOL portion 50. The top surface of the device region 42 is a top surface of the BEOL portion 50, and the bottom surface of the device region 42 is still the bottom surface of the BEOL portion 50. The insulating layer 44 is over the top surface of the BEOL portion 50, while the interconnects 46 still extend from the bottom surface of the BEOL portion 50 to the module carrier 36. In the BEOL portion 50, the dielectric layers 52 and the multi-layer metal structure 54 are configured to provide one or more passive devices (e.g., resistors, capacitors, inductors, transmission lines, and any combination of them, etc., not shown). Herein, the multi-layer metal structure 54 still includes the first metal layer 54-1 configured as the circulator metal layer and the second metal layer 54-2 configured as the ground plane (only the first metal layer 54-1 and the second metal layer 54-2 are illustrated for the multi-layer metal structure 54 for simplicity). The one or more passive devices in the BEOL portion 50 may be connected to the first metal layer 54-1 (e.g., the passive devices may include passive filters and passive programmable capacitors, which are connected to the first metal layer 54-1 in a configuration as shown in FIG. 3B).

In this embodiment, the combination of the first metal layer 54-1 in the device region 42 of the thinned flip-chip die 32, the ferrimagnetic portion 58 over the thinned flip-chip die 32, and the permanent magnetic portion 60 over the ferrimagnetic portion 58 still provides the circulator 34, which is vertically stacked with the thinned flip-chip die 32. Furthermore, the thinned flip-chip die 32 may be formed by an integrated passive device process, where the insulating layer 44 includes one or more dielectric materials (such as silicon dioxide or silicon nitride) and/or one or more polymer composite materials (such as emulation polymers, liquid crystal polymers, interlayer polymers, synthetic rubber, or other synthetic compounds etc.).

Figure 8:
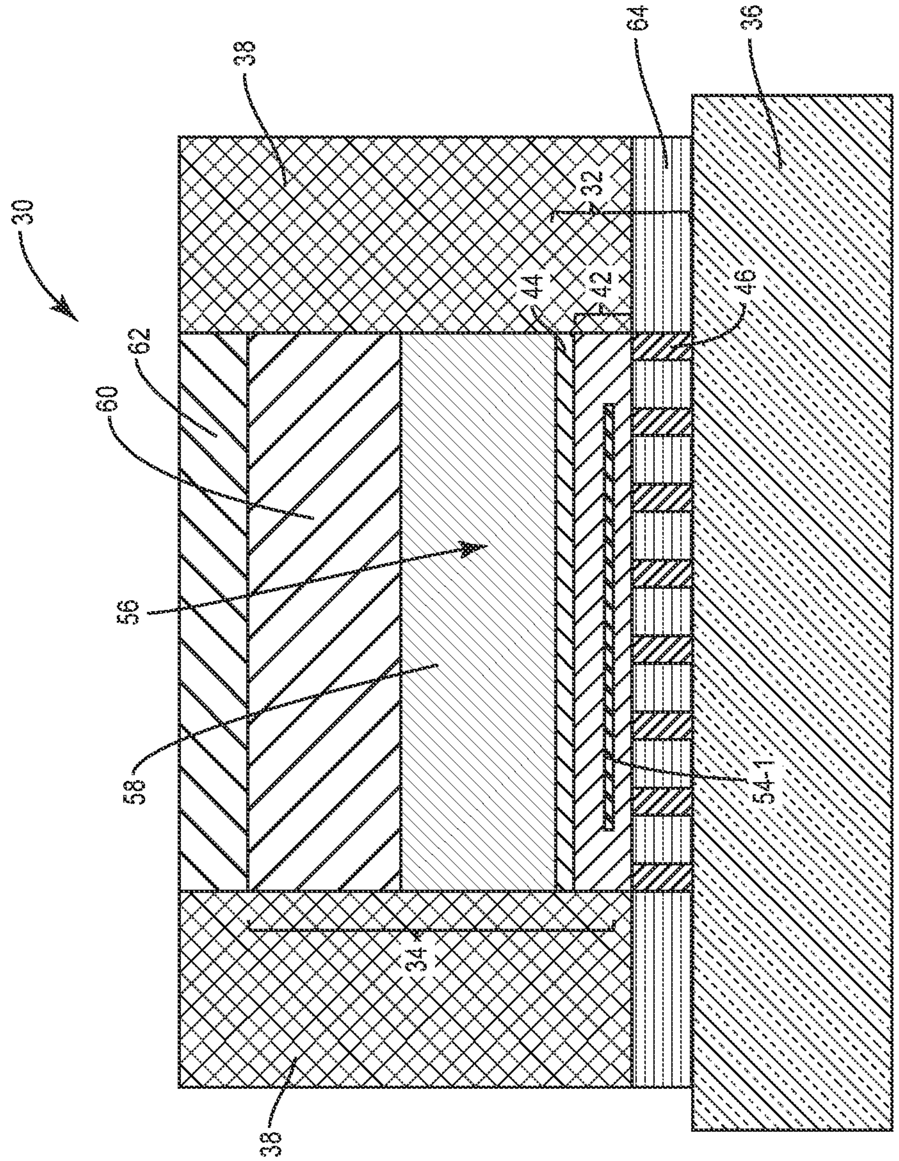

In some applications, the FEM 30 may further include an underfilling layer 64, as illustrated in FIG. 8. Herein and hereafter, the flip-chip die 32 may be either an active die or a passive die, where the device region 42 may include both the active layer 48 and the BEOL portion 50 or may include the BEOL portion 50 without any active layer. The underfilling layer 64 resides over the top surface of the module carrier 36 and fills the gaps between the bottom surface of the device region 42 and the top surface of the module carrier 36, such that the interconnects 46 are encapsulated by the underfilling layer 64. In this embodiment, the first mold compound 38 resides over the underfilling layer 64, and still surrounds the flip-chip die 32, the ferrimagnetic portion 58, and the permanent magnetic portion 60. The underfilling layer 64 may be formed of the same or different material as the first mold compound 38.

Figure 9:
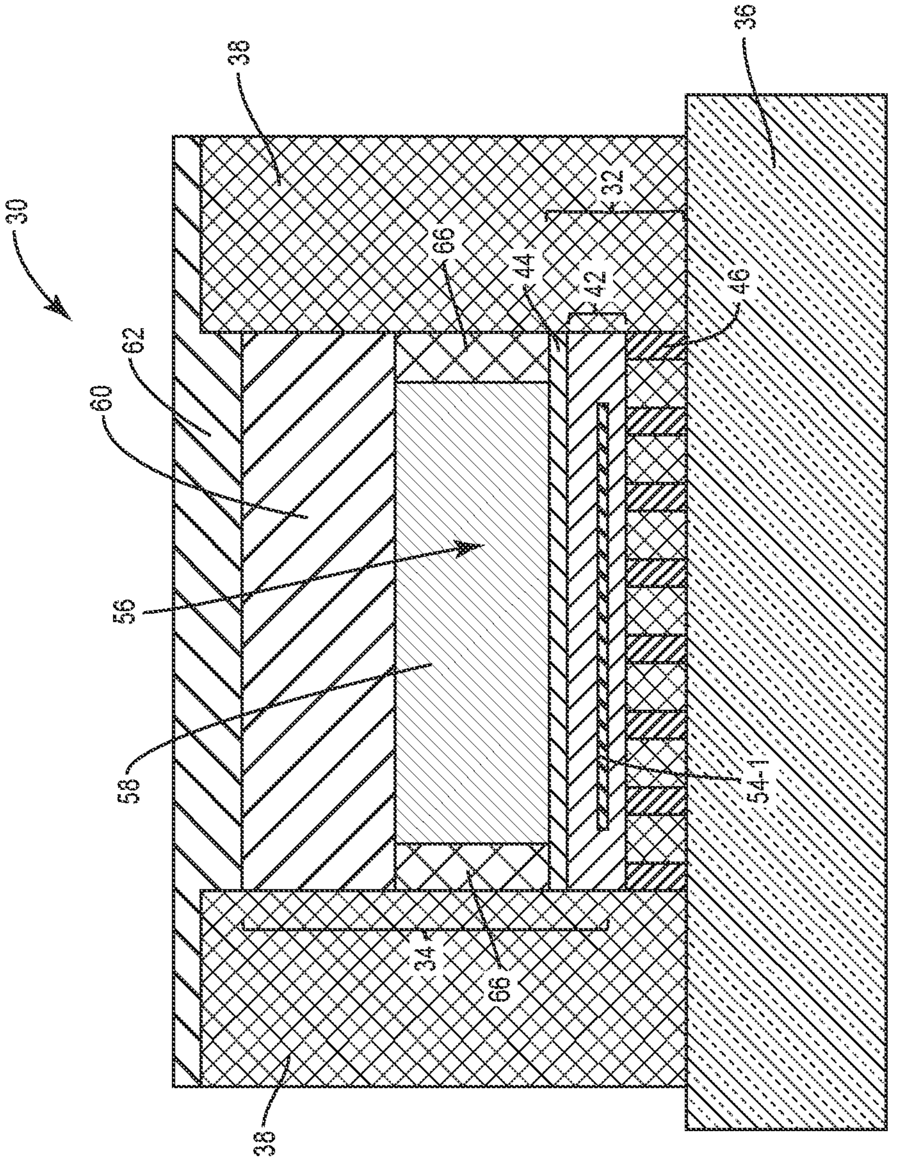

In some applications, the ferrimagnetic portion 58 and the permanent magnetic portion 60 in the circulator 34 may have different shapes and/or different sizes. As illustrated in FIG. 9, the ferrimagnetic portion 58 has a smaller size than the permanent magnetic portion 60. For instance, the ferrimagnetic portion 58 may have a circle/hexagon shape as illustrated in Figure while the permanent magnetic portion 60 may have a square shape as illustrated in FIG. 6A. In this embodiment, the FEM 30 may further include a third mold compound 66, which has a high dielectric constant (e.g., DK>=10), resides over the top surface of the thinned flip-chip die 32 and underneath the permanent magnetic portion 60, surrounds the ferrimagnetic portion 58, and fills gaps between the ferrimagnetic portion 58 and the vertical walls of the opening 56. For the performance of the circulator 34, it is critical that the ferrimagnetic portion 58 operates well into saturation. Herein, the third mold compound 66, which has a high dielectric constant and surrounds the ferrimagnetic portion 58, helps improve the saturation of the ferrimagnetic portion 58. The third mold compound 66 may be formed of one or more high dielectric constant materials, which are molding compounds with alumina and/or barium titanate having DK around 25. Furthermore, in this FEM 30, the second mold compound 62, which is configured to encapsulate the circulator 34, may further extend over the first mold compound 38.

Figure 10:
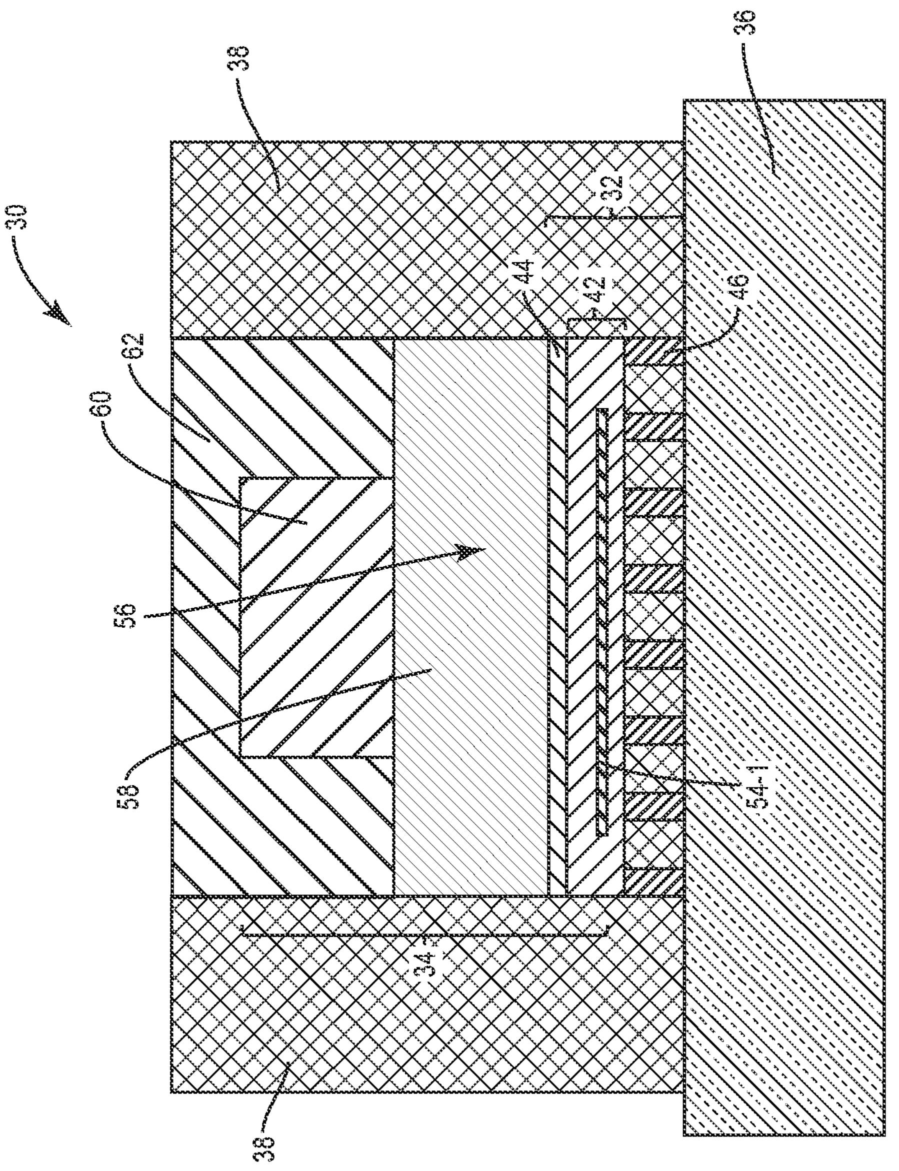

In some applications, the permanent magnetic portion 60 in the circulator 34 may not have a self-alignment shape. As illustrated in FIG. 10, the permanent magnetic portion 60 has a smaller horizontal area compared to the opening 56 and does not conform to the horizontal dimensions of the opening 56. Herein, the ferrimagnetic portion 58 in the circulator 34 may still conform to the horizontal dimensions of the opening 56 (e.g., the ferrimagnetic portion 58 having a square shape matching the opening 56 as shown in FIG. 6A). As such, the permanent magnetic portion 60 only covers a portion of the ferrimagnetic portion 58, and a top surface of the ferrimagnetic portion 58 is partially exposed through the permanent magnetic portion 60. In this embodiment, the second mold compound 62 resides over the top surface of the ferrimagnetic portion 58 to fully encapsulate the permanent magnetic portion 60. Although the self-alignment technique cannot be applied to the permanent magnetic portion 60, the permanent magnetic portion 60, the ferrimagnetic portion 58, and the first metal layer 54-1 in the device region 42 of the thinned flip-chip die 32 must be vertically aligned with each other, so as to achieve the applicable circulator 34.

Figure 11:
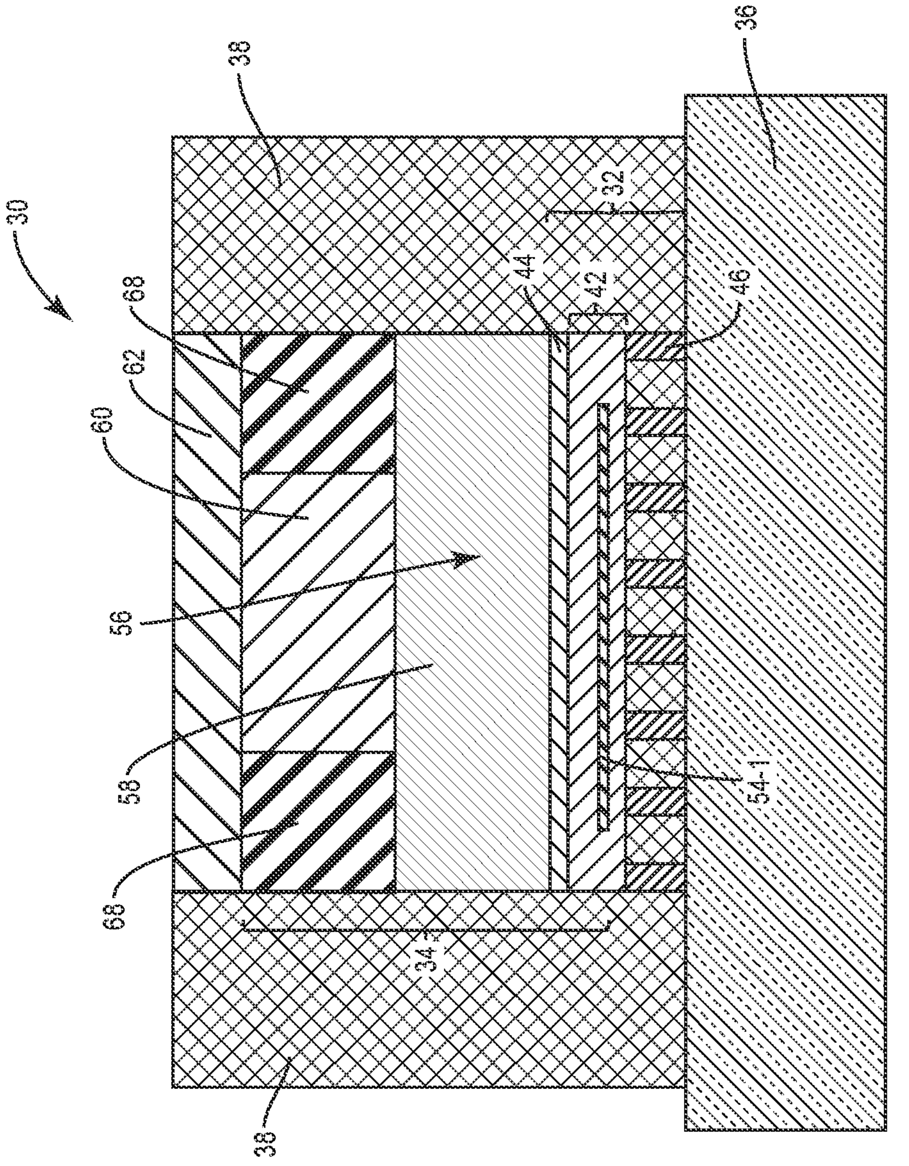

In some applications, when the permanent magnetic portion 60 has a smaller horizontal area compared to the opening 56 and does not conform to the horizontal dimensions of the opening 56, there may be an alignment material 68 to help the permanent magnetic portion 60 to conform to the vertical walls of the opening 56, as illustrated in FIG. 11. Herein, the alignment material 68 is a non-magnetic material, such as molding compound or composite with change state proprieties. The alignment material 68 resides over the top surface of the ferrimagnetic portion 58 and surrounds the permanent magnetic portion 60, and is configured to provide a shape (combining with the permanent magnetic portion to conform the horizontal dimensions of the opening 56. As such, a combination of the permanent magnetic portion 60 and the alignment material 68 is capable of being self-aligned with the thinned flip-chip die 32. In consequence, the permanent magnetic portion 60, the ferrimagnetic portion 58, and the first metal layer 54-1 in the device region 42 of the thinned flip-chip die 32 are vertically aligned with each other, so as to achieve the applicable circulator 34. In this embodiment, the second mold compound 62 resides over both the permanent magnetic portion 60 and the alignment material to encapsulate the circulator 34.

Figure 12:
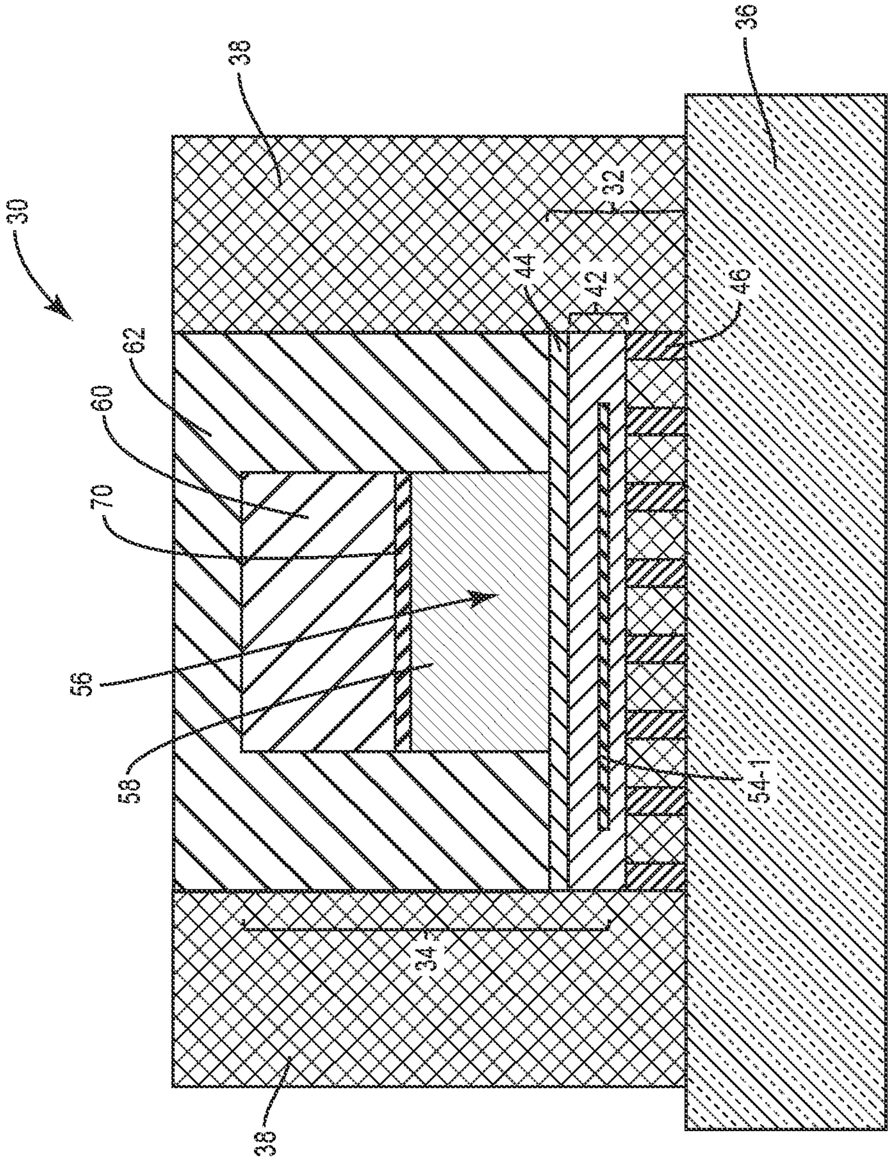

In some applications, both the ferrimagnetic portion 58 and the permanent magnetic portion 60 in the circulator 34 may not have a self-alignment shape. As illustrated in FIG. 12, each of the ferrimagnetic portion 58 and the permanent magnetic portion 60 has a smaller horizontal area compared to the opening 56 and does not conform to the horizontal dimensions of the opening 56. For the purpose of this illustration, the ferrimagnetic portion 58 and the permanent magnetic portion 60 have a same size and shape. In different applications, the ferrimagnetic portion 58 and the permanent magnetic portion 60 may have different sizes and/or shapes. Herein, the ferrimagnetic portion 58 only covers a portion of the top surface of the thinned-flip-chip die 32 and the permanent magnetic portion 60 is deposed over the ferrimagnetic portion 58 via a bonding material 70. As such, the top surface of the thinned-flip-chip die 32 is partially exposed through the ferrimagnetic portion 58 and the permanent magnetic portion 60. In this embodiment, the second mold compound 62 resides over the top surface of the thinned-flip-chip die 32 to fully encapsulate both the ferrimagnetic portion 58 and the permanent magnetic portion 60. Although the self-alignment technique cannot be applied to the ferrimagnetic portion 58 or the permanent magnetic portion 60, the permanent magnetic portion 60, the ferrimagnetic portion 58, and the first metal layer 54-1 in the device region 42 of the thinned flip-chip die 32 still must be vertically aligned with each other, so as to achieve the applicable circulator 34.

Figure 13:
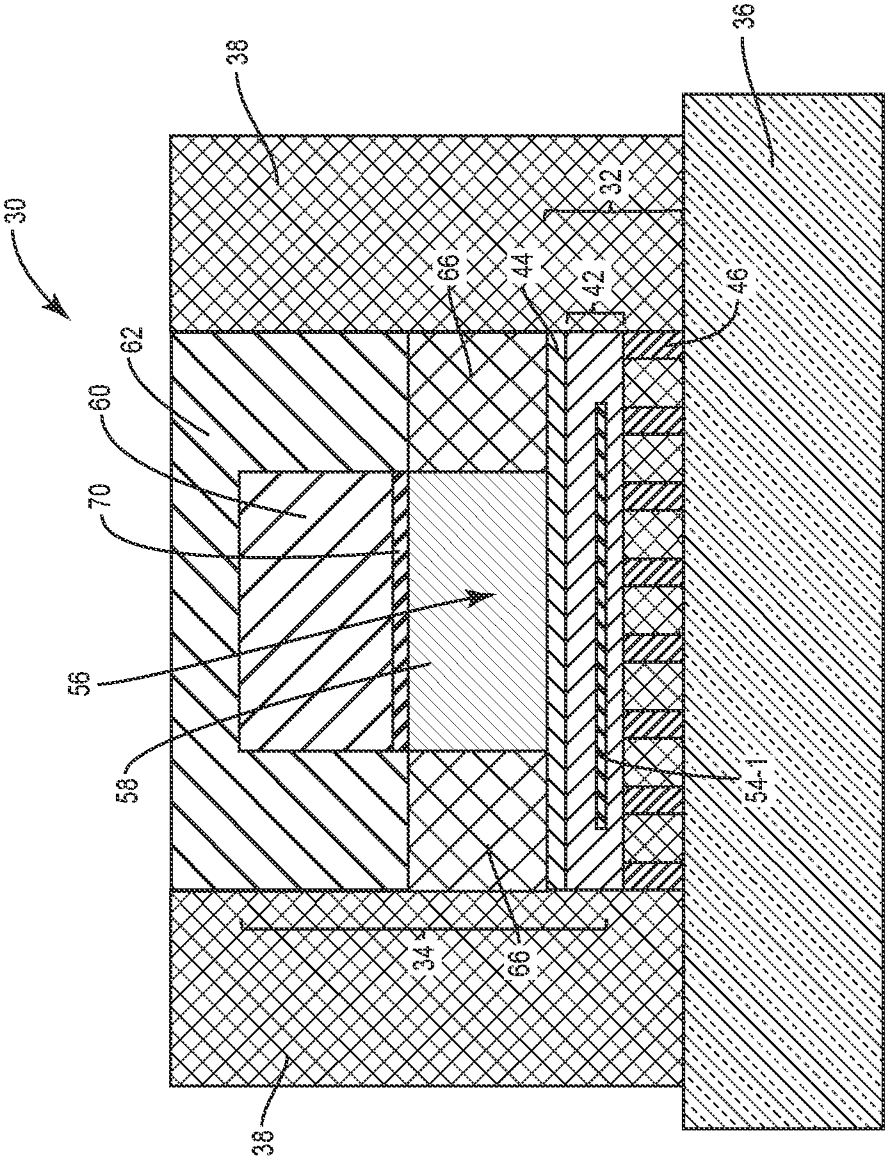

In some applications, to enhance the saturation of the ferrimagnetic portion 58, the third mold compound 66, which has a high dielectric constant (e.g., DK=10), is utilized in the FEM 30. As illustrated in FIG. 13, the third mold compound 66 resides over the exposed top surface portions of the thinned flip-chip die 32 to encapsulate sides of the ferrimagnetic portion 58, and fills the gaps between the ferrimagnetic portion 58 and the vertical walls of the opening 56. Surrounded by the high dielectric constant third mold component 66, the ferrimagnetic portion 58 may operate well into saturation. Herein, the second mold compound 62 resides over the third mold compound 66 to fully encapsulate the permanent magnetic portion 60.

FIGS. 14A-19 provide exemplary steps to fabricate the exemplary FEM 30 shown in FIG. 4 or FIG. 7. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 14A-19.

Figure 14A:
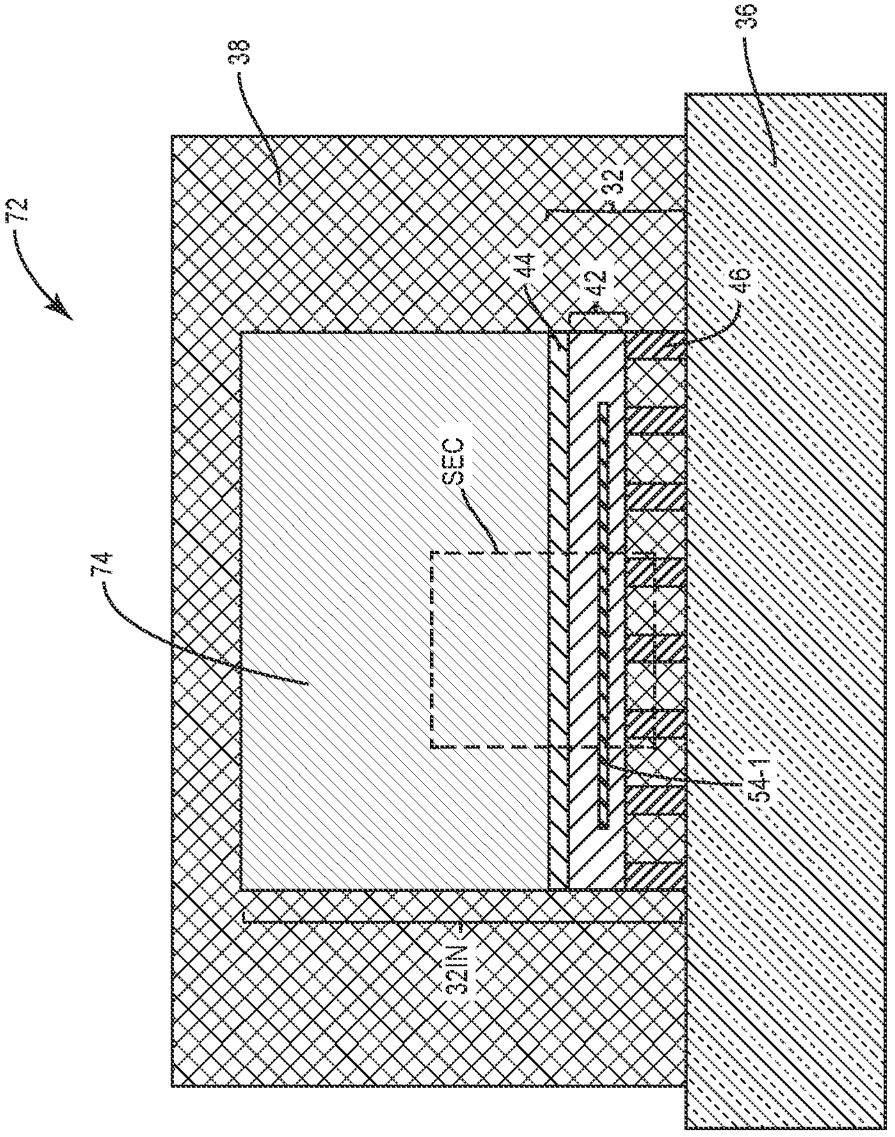

Initially, a precursor module 72 is provided as depicted in FIG. 14A. Herein, the precursor package 72 includes the module carrier 36, an intact flip-chip die 32IN deposed over the module carrier 36, and the first mold compound 38 that resides over the module carrier 36 and fully encapsulates the intact flip-chip die 32IN. In detail, the intact flip-chip die 32IN includes the device region 42 with the first metal layer 54-1 (e.g., a metal layer for a circulator), the interconnects 46 extending from the bottom surface of the device region 42 to the module carrier 36 (only one of the interconnects 46 is labeled with a reference number for clarity), the insulating layer 44 over the top surface of the device region 42, and a die substrate 74 over the insulating layer 44. As such, a backside of the die substrate 74 is a top surface of the intact flip-chip die 32IN. The die substrate 74 may be formed of low cost silicon materials. The device region 42 may have a thickness between 4 μm and 7 μm, the interconnects 46 may have a height between 15 μm and 200 μm, the insulating layer 44 may have a thickness between 0.2 μm and 2 μm, and the die substrate 74 may have a thickness between 150 μm and 500 μm. It will be clear to those skilled in the art that modifications to these thicknesses may also be considered within the scope of the concepts disclosed herein.

Figure 14C:
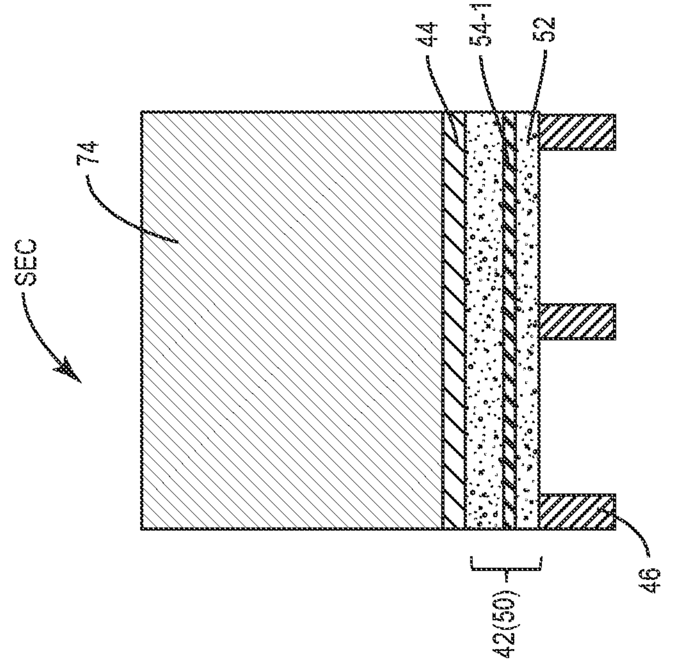
Figure 14B:
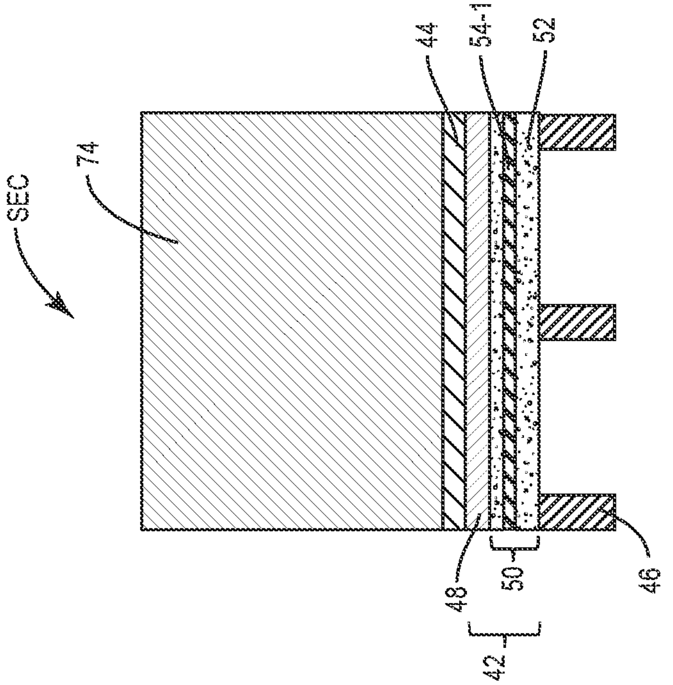

In one embodiment, the intact flip-chip die 32IN is an active die, where the device region 42 includes the active layer 48 and the BEOL portion 50 underneath the active layer 48, as illustrated in FIG. 14B (dashed box SEC in FIG. 14A). Herein, the top surface of the device region 42 is the top surface of the active layer 48, and the bottom surface of the device region 42 is the bottom surface of the BEOL portion 50. The active layer 48 is configured to provide one or more active devices (e.g., devices with one or more transistors), while the BEOL portion 50 is configured to connect the active devices in the active layer 48 to each other and/or configured to connect the active devices to external components (e.g., external dies, external antennas, or etc.). Typically, the BEOL portion 50 includes the dielectric layers 52 and the multi-layer metal structure 54 that achieves the connection function of the BEOL 50. For simplicity, only the first metal layer 54-1, which is configured for the circulator, is illustrated for the multi-layer metal structure 54. The first metal layer 54-1 may have a "Y" shape, an "X" shape, or a star shape as illustrated in FIGS. 1, 2A, and 2B.

When the intact flip-chip die 32IN is an active die, the intact flip-chip die 32IN may be formed from a SOI structure. The active layer 48 of the intact flip-chip die 32IN is formed by integrating active devices (not shown) in or on a silicon epitaxy layer of the SOI structure. The insulating layer 44 of the intact flip-chip die 32IN is a buried oxide (i.e., silicon oxide, BOX) layer of the SOI structure. In addition, the die substrate 74 of the intact flip-chip die 32IN is a silicon substrate of the SOI structure. The BEOL portion 50 and the interconnects 46 are formed underneath the active layer 48 after the active layer 48 is completed.

In one embodiment, the intact flip-chip die 32IN is a passive die, where the device region 42 does not include the active layer 48 but only includes the BEOL portion 50, as illustrated in FIG. 14C (dashed box SEC in FIG. 14A). Herein, the top surface of the device region 42 is the top surface of the BEOL portion 50, and the bottom surface of the device region 42 is the bottom surface of the BEOL portion 50. The BEOL portion 50 still includes the first metal layer 54-1, which is configured for the circulator. The insulating layer 44 is over the top surface of the BEOL portion 50, while the interconnects 46 still extend from the bottom surface of the BEOL portion 50 to the module carrier 36. When the intact flip-chip die 32IN is a passive die, the intact flip-chip die 32IN may be formed by an integrated passive device process, where the insulating layer 44 of the intact flip-chip die 32IN may include one or more dielectric materials (such as silicon dioxide or silicon nitride) and/or one or more polymer composite materials (such as emulation polymers, liquid crystal polymers, interlayer polymers, synthetic rubber, or other synthetic compounds etc.). The die substrate 74 of the intact flip-chip die 32IN may be a silicon substrate.

Regardless of the active die or a passive die, the intact flip-chip die 32IN always includes the BEOL portion 50. In the BEOL portion 50, the dielectric layers 52 and the multi-layer metal structure 54 may be configured to provide one or more passive devices (e.g., resistors, capacitors, inductors, transmission lines, and any combination of them, etc., not shown). The one or more passive devices in the BEOL portion 50 may be connected to the first metal layer 54-1 for tuning frequency responses of the circulator, which utilizes the first metal layer 54-1 as the circulator's metallization component (e.g., the passive devices may include passive filters and passive programmable capacitors, which are connected to the first metal layer 54-1 in a configuration as shown in FIG. 3B).

For the purpose of this illustration, the first mold compound 38 resides directly over the module carrier 36, fills gaps between the bottom surface of the device region 42 of the intact flip-chip die 32IN and the top surface of the module carrier 36, and fully encapsulates the intact flip-chip die 32IN. In different applications, the precursor module 72 may further include an underfilling layer (e.g., the underfilling layer 64 in FIG. 8), which is directly over the top surface of the module carrier 36, encapsulates the interconnects 46 of the intact flip-chip die 32IN, and fills the gaps between the bottom surface of the device region 42 and the top surface of the module carrier 36. In such case, the first mold compound 18 will directly reside over the underfilling layer instead of the top surface of the module carrier 36, and will retain encapsulating the intact flip-chip die 32IN.

Figure 15:
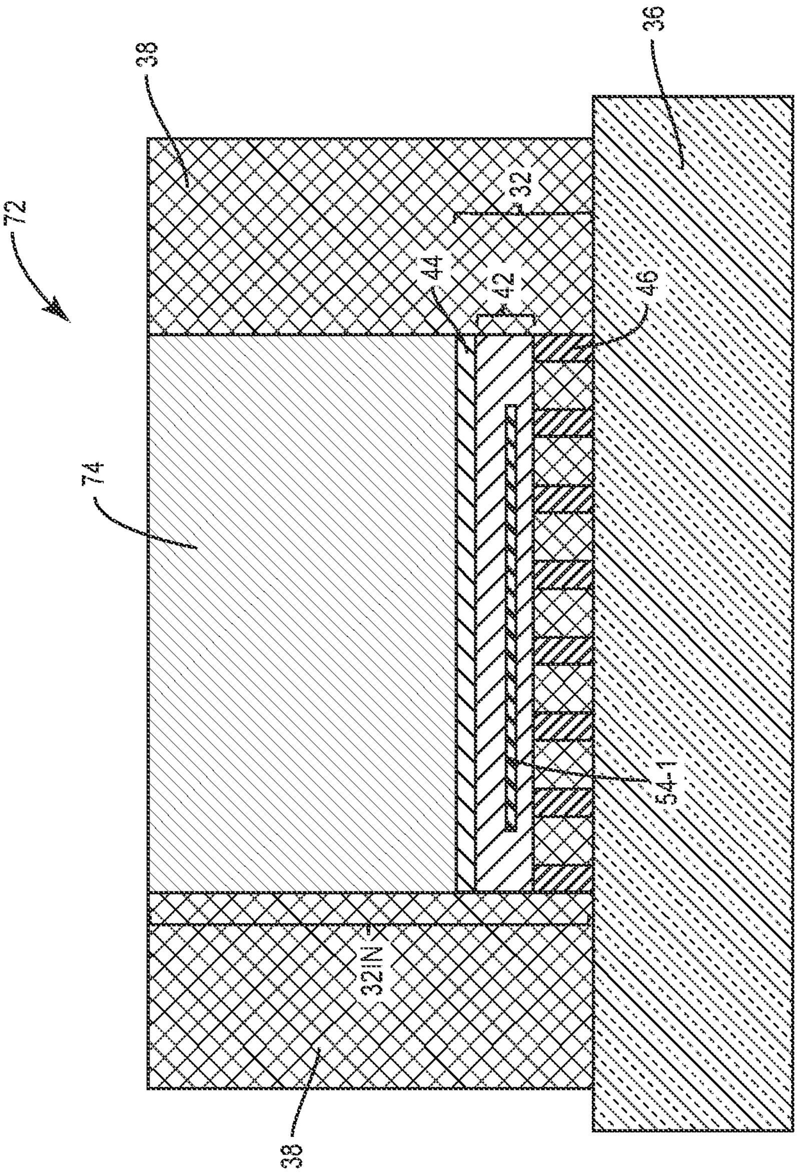
Figure 16:
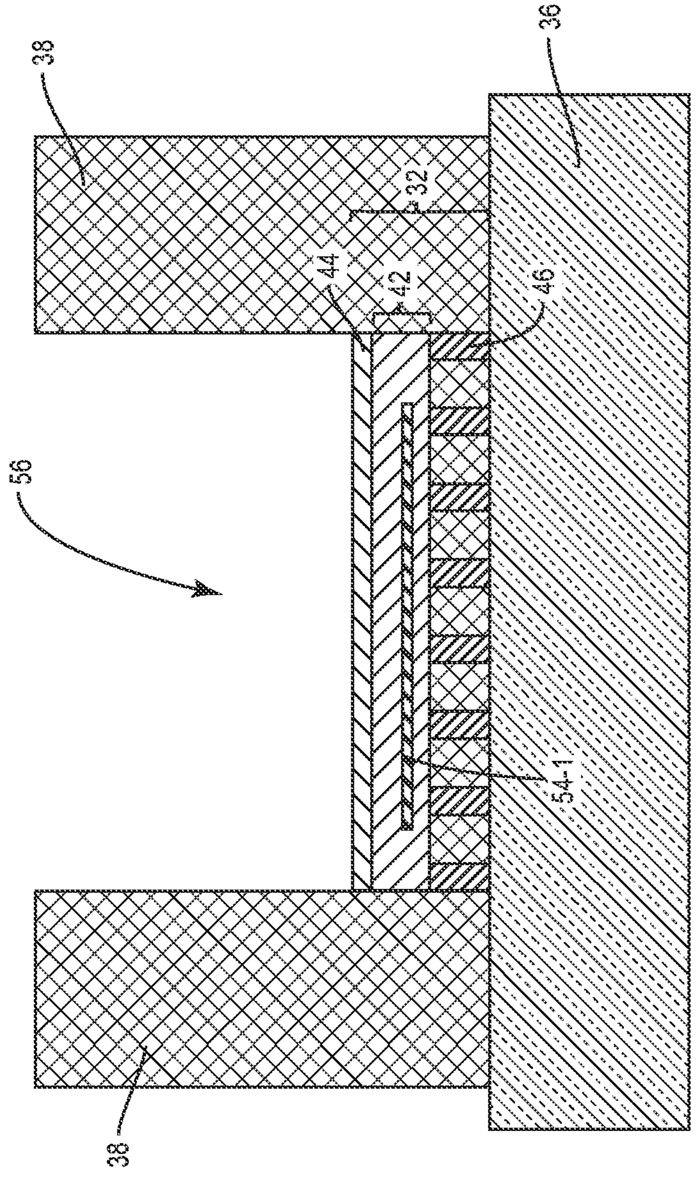

Next, the first mold compound 38 is thinned down to expose the backside of the die substrate 74 of the intact flip-chip die 32IN, as shown in FIG. 15. The thinning procedure may be done with a mechanical grinding process. The following step is to remove substantially the die substrate 74 of the intact flip-chip die 32IN to provide the thinned flip-chip die 32 and define the opening 56 over the thinned flip-chip die 32, as illustrated in FIG. 16. Herein, removing substantially the die substrate 74 refers to removing at least 95% of the entire die substrate 74, and remaining at most 2 μm die substrate or perhaps further removing a portion of the insulating layer 44. In desired cases, the die substrate 74 is fully removed, such that the top surface of the insulating layer 44 is the top surface of the thinned flip-chip die 32 and is exposed at the bottom of the opening 56. Removing substantially the die substrate 74 may be provided by an etching process with a wet/dry etchant chemistry, which may be Tetramethylammonium hydroxide (TMAH), potassium hydroxide (KOH), sodium hydroxide (NaOH), acetylcholine (ACH), or the like. During the etching process, the insulating layer 44 is functioned as an etching stop layer, which has a much slower rate of being etched than the die substrate 74 (e.g. silicon substrate) by using the wet/dry etchant chemistry. The first mold compound 38 may be used as an etchant barrier to protect the device region 42 against the etching chemistries (e.g., TMAH, KOH, ACH, and NaOH). Thus, the opening 56, where the die substrate 74 was removed, is defined within the first mold compound 38, and the vertical walls of the opening 56 are inner sides of the mold compound 38 that are aligned with the edges of the thinned flip-chip die 32 (i.e., sides of the device region 42).

Figure 17:
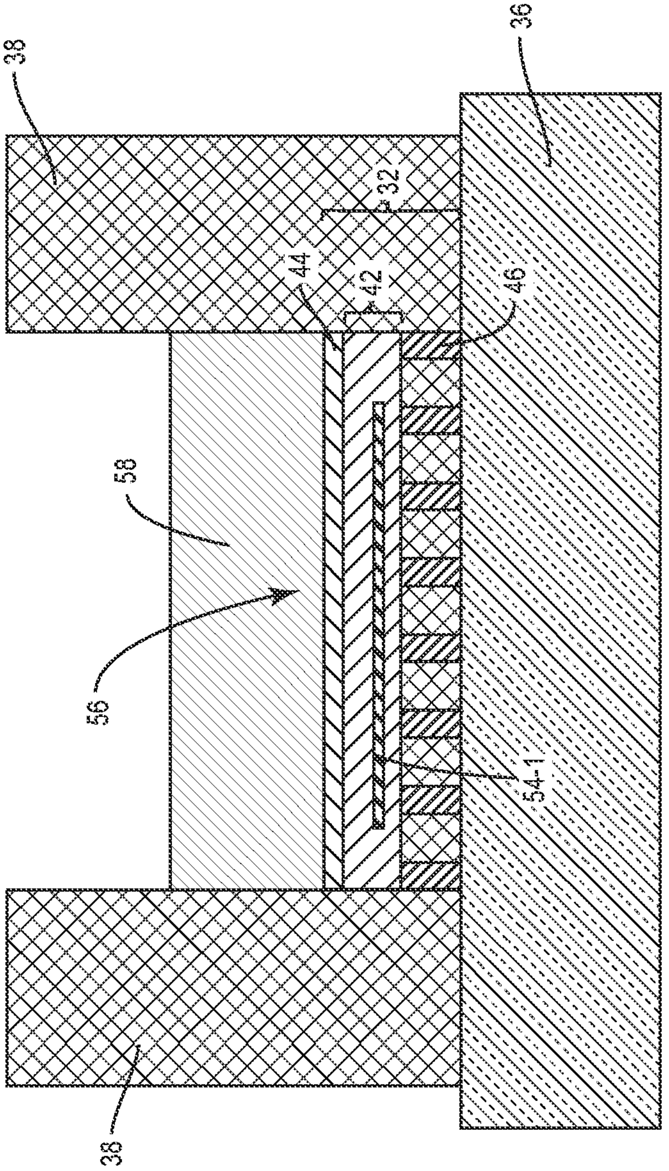

The ferrimagnetic portion 58 is then deposed over the top surface of the thinned flip-chip die 32, as illustrated in FIG. 17. The ferrimagnetic portion 58 may be formed of one or more ferrite materials, such as magnetite $Fe_3O_4$, YIG, cubic ferrites composed of iron oxides with other elements (e.g., aluminum, cobalt, nickel, manganese, and zinc), or hexagonal ferrites (e.g., $PbFe_{12}O_{19}$ and $BaFe_{12}O_{19}$ and pyrrhotite, $Fe_{1-x}S$), in a powder state or a solid block state. If the ferrimagnetic portion 58 is a powder compound, the ferrimagnetic portion 58 may be applied by a filling and/or compressed molding method. Also, the ferrimagnetic portion 58 will have a final horizontal shape the same as the horizontal area of the opening 56 and will therefore be aligned with the thinned flip-chip die 32. If the ferrimagnetic portion 58 is a solid block, the ferrimagnetic portion 58 will be inserted into the opening 56. Once the block shape of the ferrimagnetic portion 58 conforms to the horizontal dimensions of the opening 56 (e.g., shapes illustrated in FIGS. 5A-5C), the ferrimagnetic portion 58 will be self-aligned with the thinned flip-chip die 32. In addition, if there are gaps laterally between the ferrimagnetic portion 58 and the vertical walls of the opening (e.g., see FIG. 9), a high dielectric constant mold compound (e.g., the third mold compound 66) may be applied to fill the gaps to improve the saturation of the ferrimagnetic portion 58.

Figure 18A:
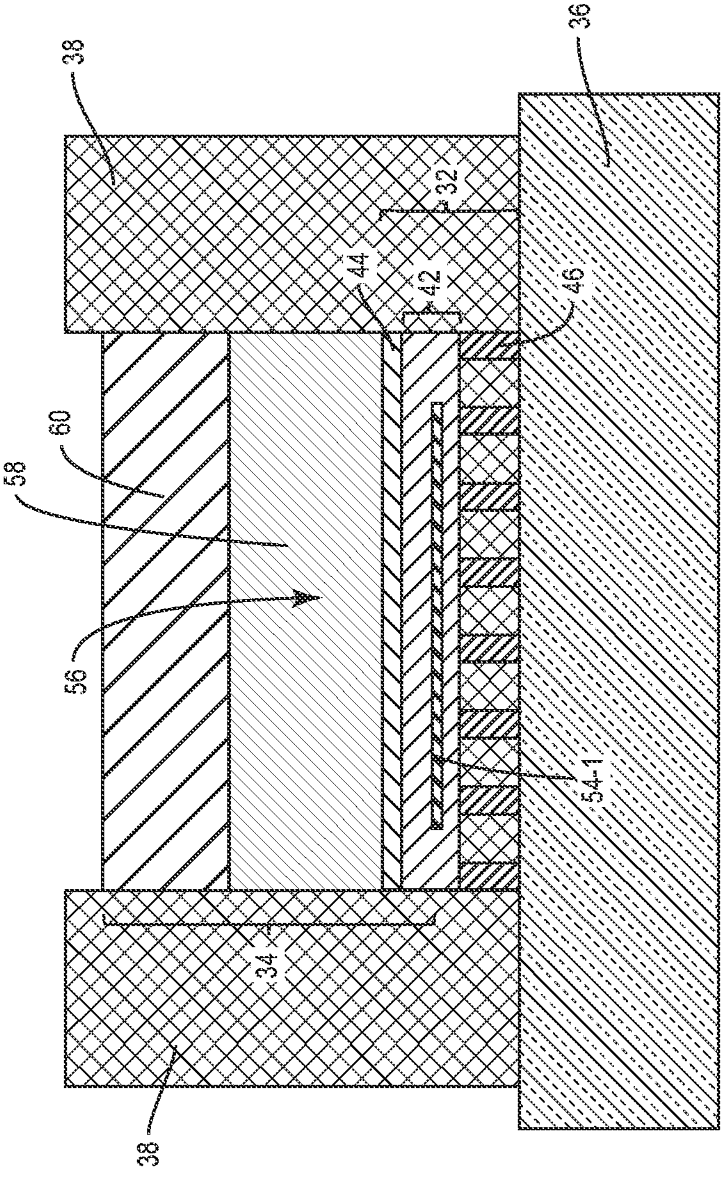

After the ferrimagnetic portion 58 is deposed, the permanent magnetic portion 60 is deposed over the ferrimagnetic portion 58, as illustrated in FIG. 18A. The permanent magnetic portion 60 is made from one or more materials that are magnetized and creates their own persistent magnetic field, such as iron, nickel, cobalt, and their alloys, alloys of rare-earth metals, and naturally occurring minerals (e.g., lodestone), in a powder state, a liquid state, or a solid block state. If the permanent magnetic portion 60 is a powder compound or a liquid compound, the permanent magnetic portion 60 may be applied by a filling and compressed molding method, and the permanent magnetic portion 60 will have a final horizontal shape the same as the horizontal area of the opening 56 and will be therefore vertically aligned with the thinned flip-chip die 32. If the permanent magnetic portion 60 is a solid block, the permanent magnetic portion 60 will be inserted into the opening 56 over the ferrimagnetic portion 58. Once the block shape of the permanent magnetic portion 60 conforms to the horizontal dimensions of the opening 56 (e.g., shapes illustrated in FIGS. 6A-6C), the permanent magnetic portion 60 will be self-aligned with the thinned flip-chip die 32.

Herein, the permanent magnetic portion 60, the ferrimagnetic portion 58, and the thinned flip-chip die 32 are vertically aligned to each other. Therefore, the first metal layer 54-1 within the device region 42 of the thinned flip-chip die 32 will be vertically aligned with the ferrimagnetic portion 58 and the permanent magnetic portion 60. In consequence, the combination of the first metal layer 54-1 in the device region 42 of the thinned flip-chip die 32, the ferrimagnetic portion 58 over the thinned flip-chip die 32, and the permanent magnetic portion 60 over the ferrimagnetic portion 58 provides the applicable circulator 34, which is vertically stacked with the thinned flip-chip die 32.

Figure 18B:
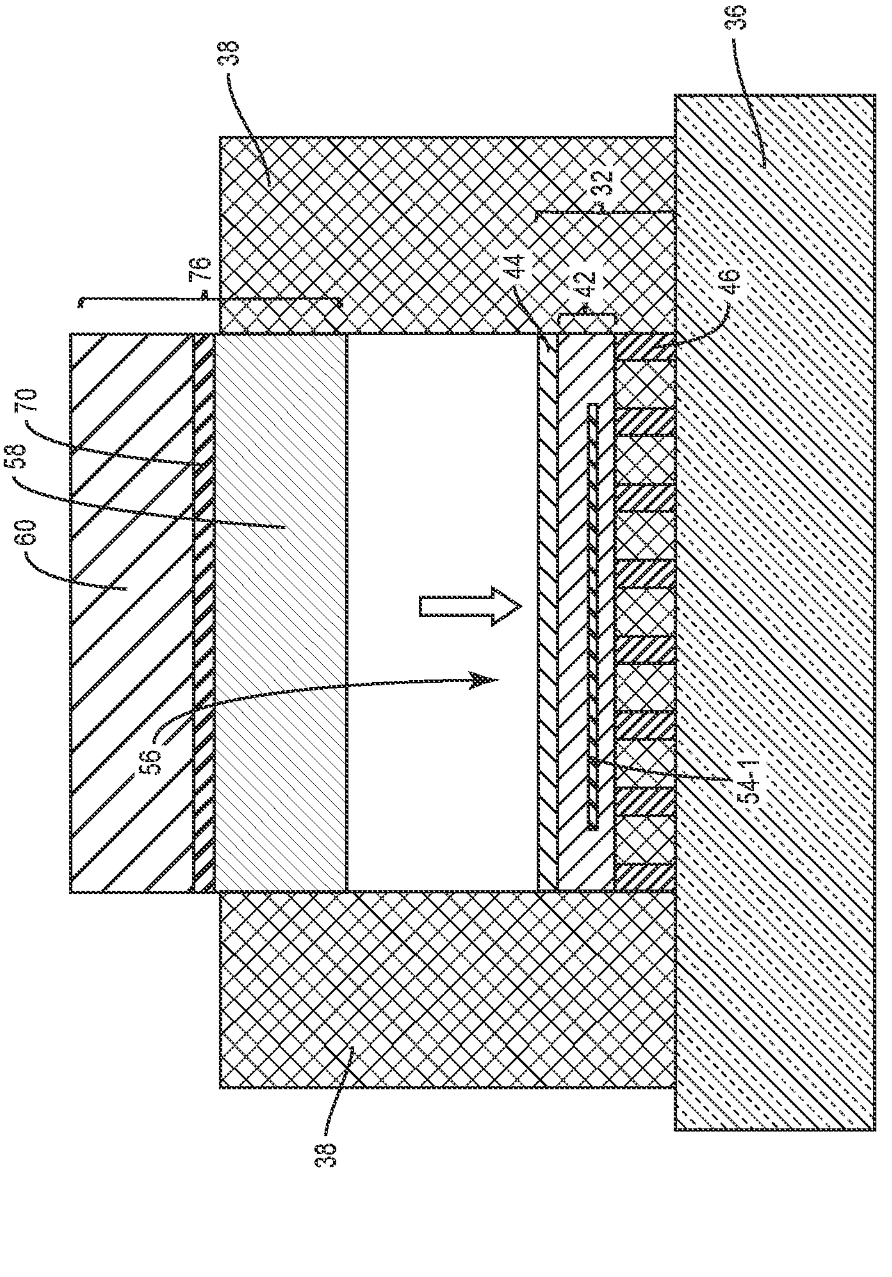

In one embodiment, when both the ferrimagnetic portion 58 and the permanent magnetic portion 60 are in the solid block state, the ferrimagnetic portion 58 and the permanent magnetic portion 60 may be bonded together before being inserted into the opening 56. As illustrated in FIG. 18B, the ferrimagnetic portion 58 and the permanent magnetic portion 60 are bonded together via the bonding material 70 as a combined block 76, and then the combined block 76 is inserted into the opening 56. As such, the ferrimagnetic portion 58 and the ferrimagnetic portion 60 are deposed simultaneously. In a desired case, the ferrimagnetic portion 58 and the permanent magnetic portion 60 have a same horizontal shape and size. Once a horizontal shape of the combined block 76 conforms to the horizontal dimensions of the opening 56, both the ferrimagnetic portion 58 and the permanent magnetic portion 60 will be self-aligned with the thinned flip-chip die 32 as well as the first metal layer 54-1 in the device region 42 of the thinned flip-chip die 32. In consequence, the combination of the first metal layer 54-1 in the device region 42 of the thinned flip-chip die 32, the ferrimagnetic portion 58 over the thinned flip-chip die 32, and the permanent magnetic portion 60 over the ferrimagnetic portion 58 provides the applicable circulator 34, which is vertically stacked with the thinned flip-chip die 32.

Figure 19:
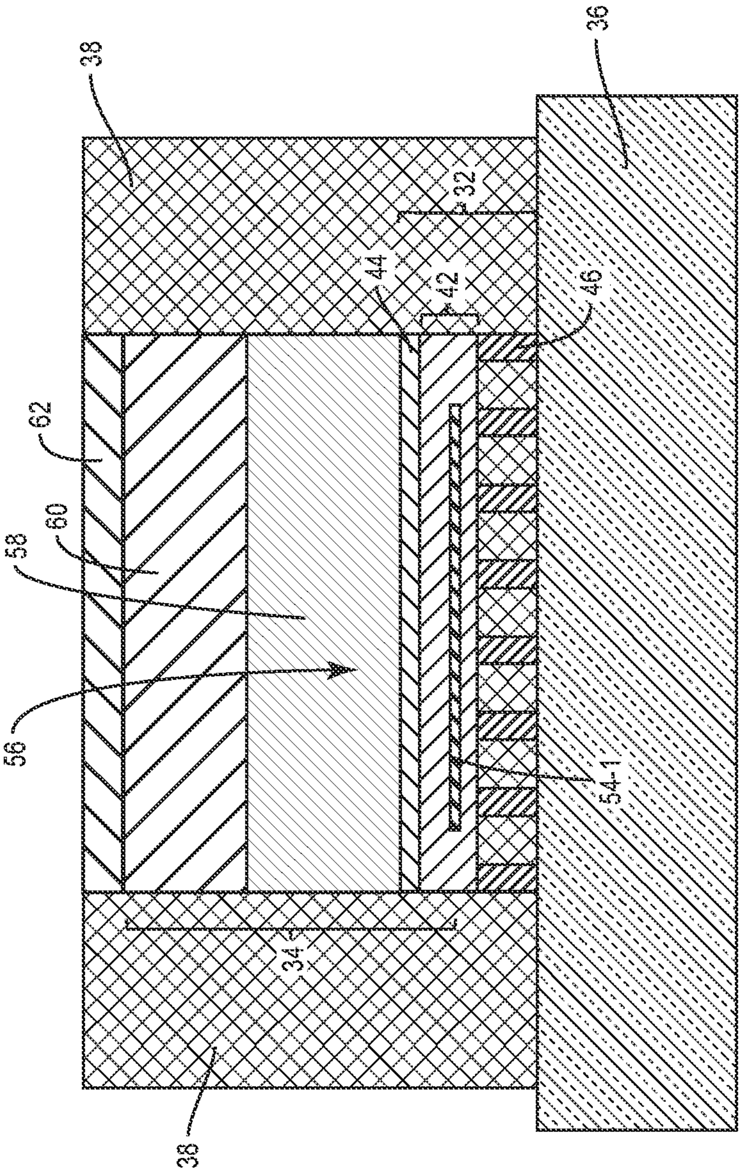

Finally, the second mold compound 62 is applied to encapsulate the circulator 34, as illustrated in FIG. 19. For the purpose of this illustration, the second mold compound 62 resides over the permanent magnetic portion 60 and within the opening 56. In different applications, the second mold compound 62 may extend over the first mold compound 38, may further cover the sides of the permanent magnetic portion 60 (when the permanent magnetic portion 60 has smaller horizontal dimensions than the opening 56, see FIG. 10), or may further cover the sides of the permanent magnetic portion 60 and the sides of the ferrimagnetic portion 58 (when both the permanent magnetic portion 60 and the ferrimagnetic portion 58 have smaller horizontal dimensions than the opening 56, see FIG. 12). The second mold compound 62 may be applied by various procedures, such as sheet molding, overmolding, compression molding, transfer molding, dam fill encapsulation, and screen print encapsulation.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A front-end module (FEM) comprising:

a module carrier;

a thinned flip-chip die that resides over the module carrier and comprises a device region with a metal layer, an insulating layer over a top surface of the device region, and a plurality of interconnects extending from a bottom surface of the device region to the module carrier;

an underfilling layer that resides over a top surface of the module carrier and fills gaps between the bottom surface of the device region of the thinned flip-chip die and the top surface of the module carrier, such that the plurality of interconnects is encapsulated by the underfilling layer;

a first mold compound residing over the underfilling layer, surrounding the thinned flip-chip die, and extending beyond a top surface of the thinned flip-chip die to define an opening over the top surface of the thinned flip-chip die, wherein the first mold compound provides vertical walls of the opening;

a ferrimagnetic portion over the top surface of the thinned flip-chip die and within the opening; and a permanent magnetic portion over the ferrimagnetic portion and within the opening, such that the permanent magnetic portion does not extend vertically beyond a top surface of the first mold compound, wherein the permanent magnetic portion, the ferrimagnetic portion, and the metal layer of the device region are vertically aligned, and a combination of the permanent magnetic portion, the ferrimagnetic portion, and the metal layer of the device region provides a circulator vertically stacked with the thinned flip-chip die.

2. The FEM of claim 1 wherein the metal layer in the device region has a thickness between fractions of a micrometer and several tens of micrometers, and has a horizontal area between several hundreds of micrometer-square and several millimeter-square.

3. The FEM of claim 1 wherein:

the thinned flip-chip die is an active die;

the device region includes an active layer and a back-end-of-line (BEOL) portion underneath the active layer;

the active layer is configured to provide one or more active devices; and the BEOL portion includes the metal layer and is configured to provide one or more integrated passive devices.

4. The FEM of claim 3 wherein:

the metal layer in the BEOL includes at least three ports;

the one or more integrated passive devices includes one or more passive filters and one or more programmable capacitors; and each of the one or more integrated passive devices is connected to a corresponding port of the at least three ports.

5. The FEM of claim 3 wherein:

the thinned flip-chip die is formed from a silicon-on-insulator (SOI) structure;

the active layer of the thinned flip-chip die is formed by integrating the one or more active devices in or on a silicon epitaxy layer of the SOI structure; and the insulating layer of the thinned flip-chip die is a buried oxide layer of the SOI structure.

6. The FEM of claim 1 wherein:

the thinned flip-chip die is a passive die; and the device region includes a BEOL portion, which includes the metal layer and is configured to provide one or more integrated passive devices.

7. The FEM of claim 6 wherein:

the metal layer in the BEOL includes at least three ports;

the one or more integrated passive devices includes one or more passive filters and one or more programmable capacitors; and each of the one or more integrated passive devices is connected to a corresponding port of the at least three ports.

8. The FEM of claim 6 wherein the insulating layer of the thinned flip-chip die comprises at least one of a dielectric material and a polymer composite material.

9. The FEM of claim 8 wherein the insulating layer of the thinned flip-chip die comprises at least one of silicon dioxide, silicon nitride, emulation polymers, liquid crystal polymers, interlayer polymers, and synthetic rubber.

10. The FEM of claim 1 wherein:

the ferrimagnetic portion includes one or more ferrites;

the ferrimagnetic portion has a thickness between few micrometers and several hundreds of micrometers; and the ferrimagnetic portion has a horizontal shape of a circle, a square, a hexagon, a rectangle, or a high order polygon.

11. The FEM of claim 1 wherein the ferrimagnetic portion includes one or more of a group consisting of magnetite $Fe_3O_4$, yttrium iron garnet (YIG), $PbFe_{12}O_{19}$, $BaFe_{12}O_{19}$, pyrrhotite, $Fe_{1-x}S$, and iron oxides with aluminum, cobalt, nickel, manganese, and zinc.

12. The FEM of claim 1 wherein:

the permanent magnetic portion is formed of one or more materials that are magnetized and creates their own persistent magnetic field;

the permanent magnetic portion has a thickness between few micrometers and several hundreds of micrometers; and the permanent magnetic portion has a horizontal shape of a circle, a square, a hexagon, a rectangle, or a high order polygon.

13. The FEM of claim 1 wherein the permanent magnetic portion is formed of one or more of a group consisting of iron, nickel, cobalt, and their alloys, alloys of rare-earth metals, and lodestone.

14. The FEM of claim 1 wherein the ferrimagnetic portion and the permanent magnetic portion have same horizontal dimensions as the opening.

15. The FEM of claim 14 further comprising a second mold compound residing over the permanent magnetic portion to encapsulate the circulator.

16. The FEM of claim 1 wherein:

the ferrimagnetic portion has same horizontal dimensions as the opening; and the permanent magnetic portion has smaller horizontal dimensions than the opening, such that a top surface of the ferrimagnetic portion is partially exposed through the permanent magnetic portion.

17. The FEM of claim 16 further comprising a second mold compound residing over the top surface of the ferrimagnetic portion and fully encapsulating the permanent magnetic portion.

18. The FEM of claim 16 further comprising an alignment material and a second mold compound, wherein:

the alignment material resides over the top surface of the ferrimagnetic portion and surrounds the permanent magnetic portion, wherein a combination of the permanent magnetic portion and the alignment material has same horizontal dimensions as the opening; and the second mold compound resides over the combination of the permanent magnetic portion and the alignment material to encapsulate the circulator.

19. The FEM of claim 1 wherein:

the ferrimagnetic portion has smaller horizontal dimensions than the opening, such that the top surface of the thinned flip-chip die is partially exposed through the ferrimagnetic portion; and the permanent magnetic portion has same horizontal dimensions as the opening.

20. The FEM of claim 19 further comprising a second mold compound and a third mold compound, wherein:

the third mold compound has a dielectric constant higher than 10;

the third mold compound resides over the top surface of the thinned flip-chip die and fills gaps laterally between the ferrimagnetic portion and the vertical walls of the opening; and the second mold compound resides over the permanent magnetic portion to encapsulate the circulator.

21. The FEM of claim 1 wherein:

the ferrimagnetic portion has smaller horizontal dimensions than the opening; and the permanent magnetic portion has smaller horizontal dimensions than the opening, such that the top surface of the thinned flip-chip die is partially exposed through the ferrimagnetic portion and the permanent magnetic portion.

22. The FEM of claim 21 further comprising a second mold compound residing over the top surface of the thinned flip-chip die, and fully encapsulating the ferrimagnetic portion and the permanent magnetic portion.

23. The FEM of claim 21 further comprising a second mold compound and a third mold compound, wherein:

the third mold compound has a dielectric constant higher than 10;

the third mold compound resides over the top surface of the thinned flip-chip die and fills gaps laterally between the ferrimagnetic portion and the vertical walls of the opening; and the second mold compound resides over the third mold compound, and fully encapsulates the permanent magnetic portion.

24. The FEM of claim 1 wherein the metal layer in the device region has one of a “Y” shape with three ports, an “X” shape with four ports, and a “star” shape with five ports.

25. The FEM of claim 1 further comprising a bonding material between the permanent magnetic portion and the ferrimagnetic portion.

26. A method comprising:

providing a precursor module comprising a module carrier, an intact flip-chip die deposed over the module carrier, and a first mold compound that resides over the module carrier and fully encapsulates the intact flip-chip die, wherein the intact flip-chip die includes a device region with a metal layer, a plurality of interconnects extending from a bottom surface of the device region to the module carrier, an insulating layer over a top surface of the device region, and a die substrate over the insulating layer, such that a backside of the die substrate is a top surface of the intact flip-chip die;

thinning down the first mold compound to expose the backside of the die substrate;

removing the die substrate substantially to provide a thinned flip-chip die and define an opening over the thinned flip-chip die and within the first mold compound;

deposing a ferrimagnetic portion over a top surface of the thinned flip-chip die and within the opening; and deposing a permanent magnetic portion over the ferrimagnetic portion and within the opening, such that the permanent magnetic portion does not extend vertically beyond a top surface of the first mold compound, wherein the permanent magnetic portion, the ferrimagnetic portion, and the metal layer of the device region are vertically aligned, and a combination of the permanent magnetic portion, the ferrimagnetic portion, and the metal layer of the device region provides a circulator vertically stacked with the thinned flip-chip die.

27. The method of claim 26 further comprising applying a second mold compound over the permanent magnetic portion so as to encapsulate and isolate the circulator from an external environment.

28. The method of claim 26 wherein:

before deposing the ferrimagnetic portion and the permanent magnetic portion, the ferrimagnetic portion and the permanent magnetic portion are bonded together via a bonding material; and deposing the ferrimagnetic portion and deposing the ferrimagnetic portion occur simultaneously.

* * * * *